(12) United States Patent
Jiang et al.

(10) Patent No.: US 11,804,509 B2
(45) Date of Patent: Oct. 31, 2023

(54) FINGERPRINT DETECTION APPARATUS AND ELECTRONIC DEVICE

(71) Applicant: SHENZHEN GOODIX TECHNOLOGY CO., LTD., Shenzhen (CN)

(72) Inventors: Peng Jiang, Shenzhen (CN); Ming Ma, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 167 days.

(21) Appl. No.: 17/357,591

(22) Filed: Jun. 24, 2021

(65) Prior Publication Data
US 2021/0319199 A1 Oct. 14, 2021

Related U.S. Application Data

(63) Continuation of application No. PCT/CN2019/111978, filed on Oct. 18, 2019.

(51) Int. Cl.
*G06V 40/13* (2022.01)
*G02B 3/00* (2006.01)
(Continued)

(52) U.S. Cl.
CPC ...... *H01L 27/14678* (2013.01); *G02B 3/0056* (2013.01); *G06V 10/145* (2022.01);
(Continued)

(58) Field of Classification Search
CPC .......... H01L 27/14678; G06V 40/1318; G06V 10/147; G06V 40/1324; G06V 10/145; G02B 3/0056
See application file for complete search history.

(56) References Cited

U.S. PATENT DOCUMENTS 8,340,362 B2 12/2012 Arai
8,466,040 B2 6/2013 Park
(Continued)

FOREIGN PATENT DOCUMENTS

CN 103198289 A 7/2013
CN 103260045 A 8/2013
(Continued)

OTHER PUBLICATIONS

Yanpeng Wang et al., "Design of Embedded Fingerprint Identification System Based on DSP," 2011 IEEE International Conference on Anti-Counterfeiting, Security and Identification, Jul. 29, 2011, pp. 47-50.
(Continued)

*Primary Examiner* — Lixi C Simpson

(57) ABSTRACT

A fingerprint detection apparatus includes a plurality of fingerprint detection units distributed in an array or disposed alternately, and each of the plurality of fingerprint detection units includes: one micro-lens configured to be disposed under the display screen; a plurality of optical sensing pixels, a center position of a photosensitive region of each of the plurality of optical sensing pixels being offset relative to a center position of the same optical sensing pixel; and at least one light shielding layer disposed between the one micro-lens and the plurality of optical sensing pixels, each of the at least one light shielding layer being provided with a hole corresponding to the plurality of optical sensing pixels. By offsetting photosensitive regions of the optical sensing pixels, the thickness of an optical fingerprint module can be reduced on the basis of improving a fingerprint identification effect on a dry finger.

19 Claims, 12 Drawing Sheets

(51) Int. Cl.
   *H01L 27/146* (2006.01)
   *G06V 10/147* (2022.01)
   *G06V 10/145* (2022.01)

(52) U.S. Cl.
   CPC ........ *G06V 10/147* (2022.01); *G06V 40/1318* (2022.01); *G06V 40/1324* (2022.01)

(56) References Cited

U.S. PATENT DOCUMENTS

| | | | |
|---|---|---|---|
| 10,216,975 | B1 | 2/2019 | He et al. |
| 10,331,932 | B2 | 6/2019 | Chen |
| 10,474,867 | B2 | 11/2019 | Yeke Yazdandoost |
| 10,497,730 | B2 | 12/2019 | Kim et al. |
| 10,503,947 | B2 | 12/2019 | Liu |
| 10,593,719 | B2 | 3/2020 | Park |
| 2004/0208348 | A1 | 10/2004 | Baharav et al. |
| 2010/0067757 | A1 | 3/2010 | Arai |
| 2010/0197071 | A1 | 8/2010 | Park |
| 2013/0169780 | A1 | 7/2013 | Wu |
| 2016/0173857 | A1* | 6/2016 | Yamazaki ......... H01L 27/14627 348/47 |
| 2017/0220838 | A1 | 8/2017 | He |
| 2017/0357840 | A1 | 12/2017 | Chen |
| 2018/0301494 | A1 | 10/2018 | Park |
| 2018/0366593 | A1 | 12/2018 | Huang |
| 2019/0033976 | A1 | 1/2019 | Cao |
| 2019/0095672 | A1 | 3/2019 | Yeke Yazdandoost |
| 2019/0147214 | A1 | 5/2019 | Dongeun |
| 2019/0156097 | A1 | 5/2019 | Liu |
| 2019/0171861 | A1 | 6/2019 | Zhang |
| 2019/0180071 | A1 | 6/2019 | Kim |
| 2019/0214420 | A1 | 7/2019 | Kim et al. |
| 2019/0228203 | A1 | 7/2019 | Kim |
| 2019/0348457 | A1 | 11/2019 | Park |
| 2020/0027912 | A1 | 1/2020 | Kim et al. |
| 2020/0035730 | A1 | 1/2020 | Tanaka |
| 2020/0226342 | A1* | 7/2020 | Lin .................... G06V 40/1318 |
| 2020/0234026 | A1 | 7/2020 | Du |
| 2020/0293738 | A1 | 9/2020 | Zhang |
| 2020/0343312 | A1* | 10/2020 | Ryu ...................... H10K 50/844 |
| 2021/0351217 | A1* | 11/2021 | Akiyama ............. G02B 5/3058 |
| 2022/0301337 | A1* | 9/2022 | Huang .............. H01L 27/14627 |

FOREIGN PATENT DOCUMENTS

| | | |
|---|---|---|
| CN | 103577821 A | 2/2014 |
| CN | 104392227 A | 3/2015 |
| CN | 104465681 A | 3/2015 |
| CN | 104681572 A | 6/2015 |
| CN | 104794433 A | 7/2015 |
| CN | 105550664 A | 5/2016 |
| CN | 105893917 A | 8/2016 |
| CN | 205665716 U | 10/2016 |
| CN | 106127000 A | 11/2016 |
| CN | 106200882 A | 12/2016 |
| CN | 106228144 A | 12/2016 |
| CN | 106298859 A | 1/2017 |
| CN | 206058224 U | 3/2017 |
| CN | 106773273 A | 5/2017 |
| CN | 107437047 A | 12/2017 |
| CN | 107480579 A | 12/2017 |
| CN | 107728240 A | 2/2018 |
| CN | 107799541 A | 3/2018 |
| CN | 107910344 A | 4/2018 |
| CN | 207586941 U | 7/2018 |
| CN | 207650835 U | 7/2018 |
| CN | 108615746 A | 10/2018 |
| CN | 108734073 A | 11/2018 |
| CN | 108881750 A | 11/2018 |
| CN | 108885696 A | 11/2018 |
| CN | 109074474 A | 12/2018 |
| CN | 109145702 A | 1/2019 |
| CN | 109154961 A | 1/2019 |
| CN | 109270988 A | 1/2019 |
| CN | 109472236 A | 3/2019 |
| CN | 109496308 A | 3/2019 |
| CN | 109564623 A | 4/2019 |
| CN | 109564627 A | 4/2019 |
| CN | 109583381 A | 4/2019 |
| CN | 208739213 U | 4/2019 |
| CN | 109791612 A | 5/2019 |
| CN | 208848221 U | 5/2019 |
| CN | 208888842 U | 5/2019 |
| CN | 109844766 A | 6/2019 |
| CN | 109858465 A | 6/2019 |
| CN | 109863506 A | 6/2019 |
| CN | 109983471 A | 7/2019 |
| CN | 109993051 A | 7/2019 |
| CN | 110021612 A | 7/2019 |
| CN | 110023956 A | 7/2019 |
| CN | 110036397 A | 7/2019 |
| CN | 110062931 A | 7/2019 |
| CN | 209168144 U | 7/2019 |
| CN | 110088768 A | 8/2019 |
| CN | 110096928 A | 8/2019 |
| CN | 209496381 U | 10/2019 |
| CN | 110945525 A | 3/2020 |
| CN | 210864750 U | 6/2020 |
| CN | 107004130 B | 8/2020 |
| CN | 211375615 U | 8/2020 |
| CN | 211375616 U | 8/2020 |
| CN | 211375617 U | 8/2020 |
| CN | 105956545 B | 9/2020 |
| EP | 3267359 A1 | 1/2018 |
| EP | 3514727 A2 | 7/2019 |
| JP | 2004020622 A | 1/2004 |
| KR | 20180005588 A | 1/2018 |
| KR | 20190048282 A | 5/2019 |
| KR | 20190069126 A | 6/2019 |
| WO | 2016064223 A1 | 4/2016 |
| WO | 2017129126 A1 | 8/2017 |
| WO | 2018020846 A1 | 2/2018 |
| WO | WO2018180569 A1 | 10/2018 |
| WO | WO2019112282 A1 | 6/2019 |
| WO | WO2021007730 A1 | 1/2021 |

OTHER PUBLICATIONS

Wang Yuzhu, "Research of Fingerprint Identification Based on Alignment-free Fingerprint Feature," China Master's Theses Full-text Database—Information Science and Technology, Jul. 15, 2015, pp. 1-42, vol. 2015, Issue 07.

Li Chengshang, "A Polarized Imaging System For Multimodal Finger-Feature Acquisition," China Master's Theses Full-text Database—Information Science and Technology, Mar. 15, 2017, pp. 1-51, vol. 2017, Issue 03.

Jang K.W. et al., "Ultrathin Contact-Imaging Camera for Fingerprint Imaging Using Microlens Array and Multiple Block Layers," 2018 International Conference on Optical MEMS and Nanophotonics (OMN), Sep. 6, 2018, pp. 123-124.

Zhang Yufei, "The study on fingerprint imaging of mobile phone based on the self-focusing lens array," China Master's Theses Full-text Database—Information Science and Technology, Jan. 15, 2019, pp. 1-75, vol. 2019, Issue 01.

Ji Zi-Juan et al. "The Optical Design of Fingerprint Identification System", Journal of Hubei University of Education; Feb. 20, 2008; pp. 69-71; vol. 25 No.2.

Zhang Zhanqiang et al. "Light Field Imaging with Micro Lens Array", Journal of Capital Normal University (Natural Science Edition); Feb. 15, 2016; pp. 15-19; vol. 37(1).

* cited by examiner

FINGERPRINT DETECTION APPARATUS AND ELECTRONIC DEVICE

CROSS-REFERENCE TO RELATED APPLICATIONS

This application is a continuation of International Application No. PCT/CN2019/111978, filed on Oct. 18, 2019, the disclosure of which is hereby incorporated by reference in its entirety.

TECHNICAL FIELD

Embodiments of the present application relate to the field of fingerprint detection, and more particularly, to a fingerprint detection apparatus and an electronic device.

BACKGROUND

With rapid development of a terminal industry, biometric identification technology has received more and more attention from people, and practical usage of more convenient under-screen biometric identification technology, such as under-screen optical fingerprint identification technology, has become a popular requirement. Under-screen optical fingerprint identification technology is to set an optical fingerprint module under a display screen, and implement fingerprint identification by capturing an optical fingerprint image. The principle of an under-screen fingerprint optical system is to use a screen to emit light itself to illuminate a fingerprint, and capture and identify a light signal by an under-screen optical fingerprint module after the light signal reflected by a finger above the screen passes through the screen. For example, the optical fingerprint module may converge the received light signal to an optical sensing pixel array through a micro-lens array, and the optical sensing pixel array generates a fingerprint image based on the received light signal, and then performs fingerprint identification.

In the related art, the micro-lens array is located directly above or obliquely above the optical sensing pixel array, and one micro-lens corresponds to one optical sensing pixel, that is, each micro-lens in the micro-lens array focuses received light to an optical sensing pixel corresponding to the same micro-lens. Optical sensing pixels in the optical sensing pixel array are arranged periodically, and a photosensitive region of each optical sensing pixel in the optical sensing pixel array is disposed in a center position of the same optical sensing pixel, so as to improve the duty cycle of the photosensitive region.

However, the photosensitive regions of the optical sensing pixel array are affected by the size of the micro-lens array, and a thickness of an optical fingerprint module is relatively large, which further increases the processing difficulty, cycle and cost of a light path of the optical fingerprint module. In addition, the optical sensing pixel array has a poor identification effect on a dry finger.

Therefore, how to reduce the thickness of an optical fingerprint module on the basis of improving a fingerprint identification effect on a dry finger has become an urgent technical problem to be solved.

SUMMARY

Embodiments of the present application provide a fingerprint detection apparatus and an electronic device, which could reduce the thickness of an optical fingerprint module on the basis of improving a fingerprint identification effect on a dry finger.

In a first aspect, provided is a fingerprint detection apparatus, where the fingerprint detection apparatus is applied under a display screen to implement under-screen optical fingerprint detection, and the fingerprint detection apparatus includes a plurality of fingerprint detection units distributed in an array or disposed alternately, and each of the plurality of fingerprint detection units includes:

one micro-lens configured to be disposed under the display screen;

a plurality of optical sensing pixels, a center position of a photosensitive region of each of the plurality of optical sensing pixels being offset relative to a center position of the same optical sensing pixel; and at least one light shielding layer disposed between the one micro-lens and the plurality of optical sensing pixels, each of the at least one light shielding layer being provided with a hole corresponding to the plurality of optical sensing pixels, where after being converged by the one micro-lens, oblique light signals in multiple directions reflected from a finger above the display screen are respectively transmitted to photosensitive regions of the plurality of optical sensing pixels through the hole provided in the at least one light shielding layer, and the oblique light signals are used to detect fingerprint information of the finger.

After being converged by the one micro-lens, oblique light signals in multiple directions reflected from a finger above the display screen are respectively transmitted to the plurality of optical sensing pixels through the hole provided in the at least one light shielding layer, which can not only reduce exposure time of the plurality of optical sensing pixels, as well as the thickness and cost of the fingerprint detection apparatus, but also improve the robustness, tolerability of a tolerance, field angle and field of view of the fingerprint detection apparatus, thereby improving a fingerprint identification effect, especially a fingerprint identification effect on a dry finger.

In addition, a center position of a photosensitive region of each of the plurality of optical sensing pixels is offset relative to a center position of the same optical sensing pixel, which can further increase an image distance of the one micro-lens in the case that a vertical distance between the one micro-lens and the plurality of optical sensing pixels is constant, and can further reduce the thickness of the fingerprint detection apparatus.

In some possible implementation manners, a distance between a center position of each of the plurality of optical sensing pixels and a center position of the one micro-lens is less than a distance between a center position of a photosensitive region of the same optical sensing pixel and the center position of the one micro-lens.

Therefore, the thickness of the fingerprint detection apparatus can be reduced on the basis that there is a sufficient image distance between the plurality of optical sensing pixels and the one micro-lens.

In some possible implementation manners, a light spot region is formed on the photosensitive region of each of the plurality of optical sensing pixels through the hole provided in the at least one light shielding layer, and a center position of the light spot region is offset by a first distance relative to a projection of a center position of the one micro-lens on a plane where the plurality of optical sensing pixels are located, and a connecting line between the center position of the one micro-lens and the center position of the light spot region forms a first included angle with a direction perpendicular to the display screen, and the first distance is inversely proportional to a cotangent of the first included angle.

In some possible implementation manners, a vertical distance between the one micro-lens and the plurality of optical sensing pixels is equal to a product of the cotangent of the first included angle and the first distance.

In some possible implementation manners, the light spot region is disposed on a side of the photosensitive region close to or away from the one micro-lens.

Therefore, the one micro-lens and the plurality of optical sensing pixels meet imaging requirements, so that the one micro-lens can image fingerprint information of the corresponding region to the photosensitive regions of the plurality of optical sensing pixels.

In some possible implementation manners, the center position of the photosensitive region of each of the plurality of optical sensing pixels is offset in a direction away from or close to a center position of the plurality of optical sensing pixels relative to the center position of the same optical sensing pixel.

Therefore, the thickness of the fingerprint detection apparatus can be reduced on the basis that there is a sufficient image distance between the plurality of optical sensing pixels and the one micro-lens.

In some possible implementation manners, the plurality of optical sensing pixels are disposed below the one micro-lens, and the center position of the photosensitive region of each of the plurality of optical sensing pixels is offset in a direction away from the center position of the plurality of optical sensing pixels relative to the center position of the same optical sensing pixel.

In some possible implementation manners, the plurality of optical sensing pixels are respectively located below a plurality of micro-lenses adjacent to the one micro-lens, and the center position of the photosensitive region of each of the plurality of optical sensing pixels is offset in a direction away from or close to the center position of the plurality of optical sensing pixels relative to the center position of the same optical sensing pixel.

In some possible implementation manners, the center position of the photosensitive region of each of the plurality of optical sensing pixels is offset along a diagonal line of the same optical sensing pixel so that the center position of the photosensitive region of each of the plurality of optical sensing pixels is located on the diagonal line of the same optical sensing pixel.

In some possible implementation manners, the center position of the photosensitive region of each of the plurality of optical sensing pixels is offset along a side length of the same optical sensing pixel so that a connecting line of the center position of the photosensitive region of each of the plurality of optical sensing pixels and the center position of the same optical sensing pixel is parallel to the side length of the same optical sensing pixel.

In some possible implementation manners, the center position of the photosensitive region of each of the plurality of optical sensing pixels is offset by a first distance relative to the center position of the same optical sensing pixel, each of the plurality of optical sensing pixels is a rectangular pixel, and the first distance is less than or equal to a side length P of the rectangular pixel.

In some possible implementation manners, the first distance ranges from P/10 to P/2.

In some possible implementation manners, an included angle of an oblique light signal in each of the multiple directions relative to the display screen ranges from 10 degrees to 60 degrees.

In some possible implementation manners, included angles of the oblique light signals in the multiple directions relative to the display screen are the same.

In some possible implementation manners, the at least one light shielding layer is a plurality of light shielding layers, and a bottom light shielding layer of the plurality of light shielding layers is provided with a plurality of holes correspondingly to the plurality of optical sensing pixels respectively, so that the one micro-lens converges the oblique light signals in the multiple directions to the photosensitive regions of the plurality of optical sensing pixels respectively through the plurality of holes.

In some possible implementation manners, apertures of the holes in the plurality of light shielding layers corresponding to the same optical sensing pixel are sequentially decreased from top to bottom.

In some possible implementation manners, a top light shielding layer of the plurality of light shielding layers is provided with at least one hole corresponding to the plurality of optical sensing pixels.

In some possible implementation manners, a metal wiring layer of the plurality of optical sensing pixels is disposed at a back focal plane position of the one micro-lens, and the metal wiring layer is respectively provided with a plurality of holes above the photosensitive regions of plurality of optical sensing pixels to form the bottom light shielding layer of the plurality of light shielding layers.

In some possible implementation manners, the at least one light shielding layer is one light shielding layer, and the one light shielding layer is provided with a plurality of oblique holes corresponding to the plurality of optical sensing pixels respectively, so that the one micro-lens converges the oblique light signals in the multiple directions to the photosensitive regions of the plurality of optical sensing pixels respectively through the plurality of oblique holes.

In some possible implementation manners, a thickness of the one light shielding layer is greater than or equal to a preset thickness, so that the plurality of oblique holes are respectively configured to transmit the oblique light signals in the multiple directions.

In some possible implementation manners, the fingerprint detection apparatus further includes:
a transparent medium layer,
where the transparent medium layer is configured to connect the one micro-lens, the at least one light shielding layer and the plurality of optical sensing pixels.

In some possible implementation manners, the fingerprint detection apparatus further includes:
a filter layer,
where the filter layer is disposed in light paths between the one micro-lens and the plurality of optical sensing pixels or above the one micro-lens, and the filter layer is configured to filter out a light signal with a non-target wavelength band and transmit a light signal with a target wavelength band.

In a second aspect, provided is an electronic device, including:
a display screen, and the fingerprint detection apparatus in the first aspect or any one possible implementation manner of the first aspect, where the fingerprint detection apparatus is disposed under the display screen to implement under-screen optical fingerprint detection.

DESCRIPTION OF EMBODIMENTS

Technical solutions of the present application are described below in combination with accompanying drawings.

The technical solutions of embodiments of the present application may be applied to various electronic devices, for example, portable or mobile computing devices such as a smart phone, a notebook computer, a tablet computer and a game device, and other electronic devices such as an electronic database, an automobile and an automated teller machine (ATM), which are not limited in the embodiments of the present application.

The technical solutions of the embodiments of the present application may be applied to biometric identification technology. The biometric identification technology includes, but is not limited to, identification technology such as fingerprint identification, palm print identification, iris identification, human face identification and living body identification. For convenience of illustration, fingerprint identification technology is described below as an example.

The technical solutions of the embodiments of the present application may be used for under-screen fingerprint identification technology and in-screen fingerprint identification technology.

The under-screen fingerprint identification technology refers to mounting a fingerprint identification module under a display screen, so as to implement a fingerprint identification operation in a display region of the display screen without setting a fingerprint capturing region in a region other than the display region on the front surface of an electronic device. Specifically, the fingerprint identification module uses light returned from a top surface of a display component of the electronic device for fingerprint sensing and other sensing operations. This returned light carries information about an object (for example, a finger) that is in contact with or approaches the top surface of the display component, and the fingerprint identification module located under the display component implements under-screen fingerprint identification by capturing and detecting the returned light. The fingerprint identification module may be designed to achieve desired optical imaging by properly configuring an optical element for capturing and detecting returned light, so as to detect fingerprint information of the finger.

Correspondingly, the in-screen (In-display) fingerprint identification technology refers to mounting a fingerprint identification module or a part of a fingerprint identification module inside a display screen, so as to implement a fingerprint identification operation in a display region of the display screen without setting a fingerprint capturing region in a region other than the display region on the front surface of an electronic device.

Figure 1:
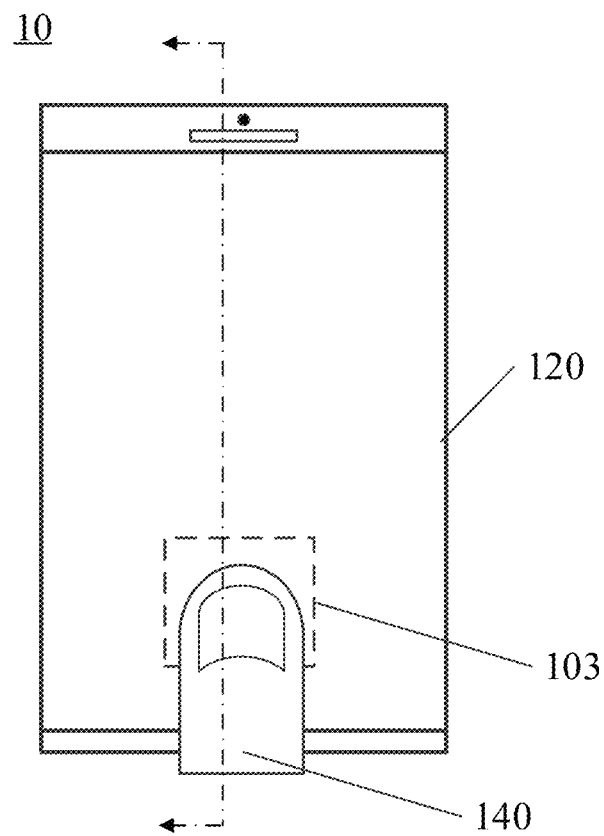
FIG. 1 is a schematic structural diagram of an electronic device to which the present application is applicable.
Figure 2:
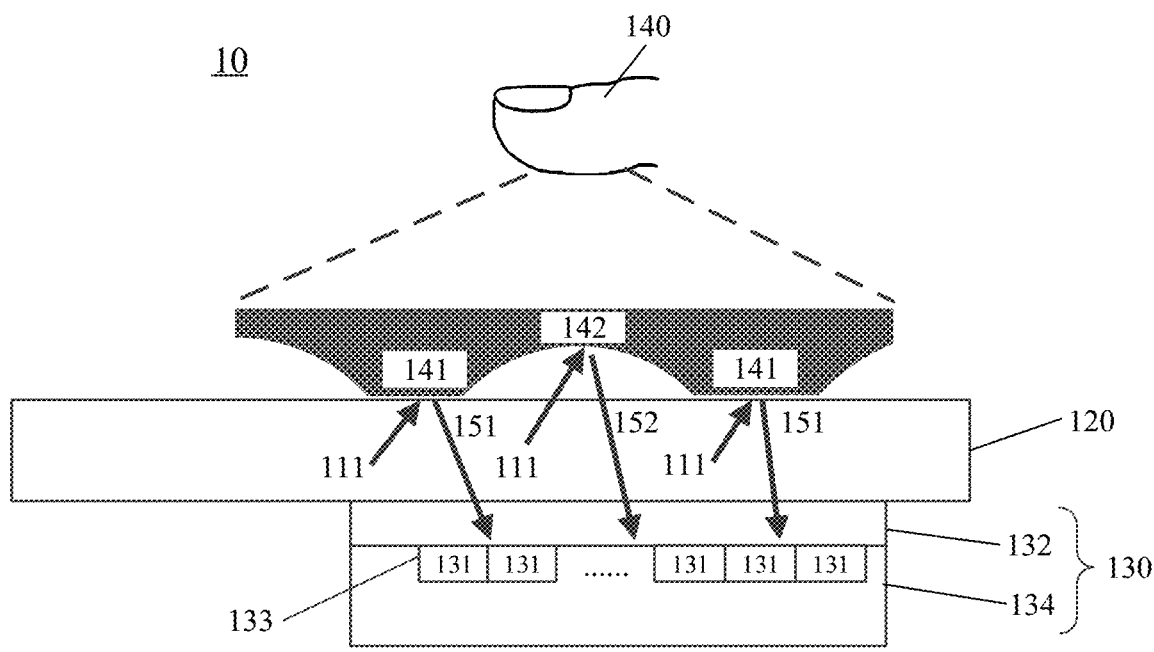
FIG. 2 is a schematic cross-sectional view of the electronic device shown in FIG. 1.
Figure 3:
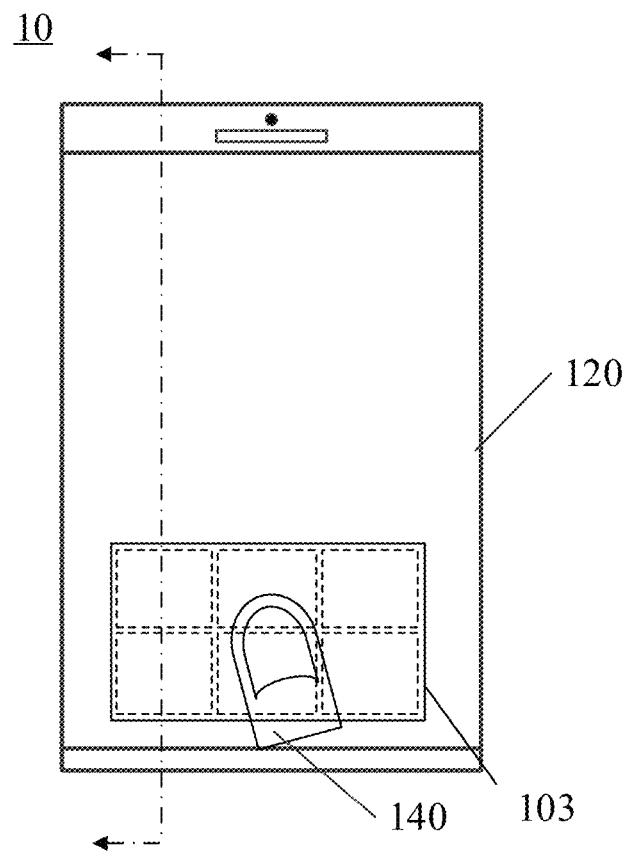
FIG. 3 is another schematic structural diagram of an electronic device to which the present application is applicable.
Figure 4:
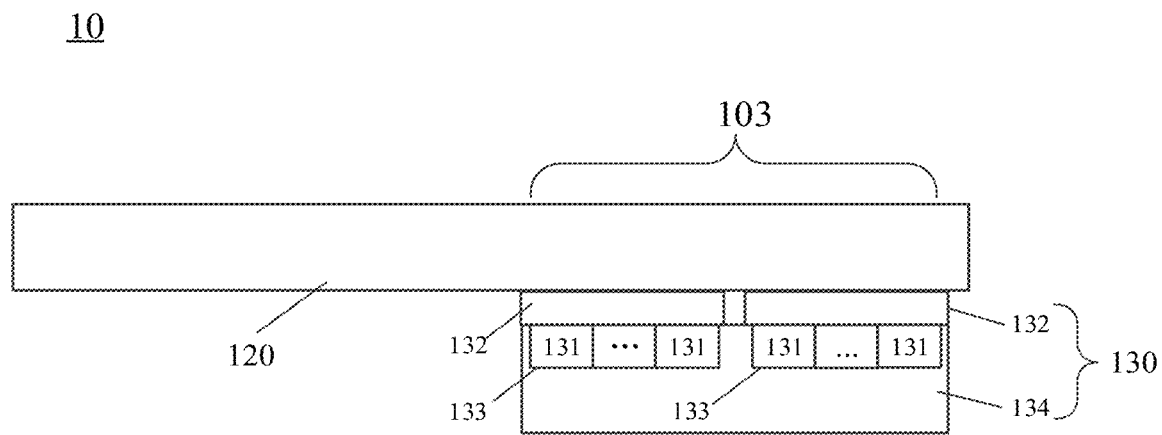
FIG. 4 is a schematic cross-sectional view of the electronic device shown in FIG. 3.

FIGS. 1 to 4 are schematic diagrams of an electronic device to which embodiments of the present application are applicable. FIG. 1 and FIG. 3 are schematic oriented diagrams of an electronic device 10; and FIG. 2 and FIG. 4 are schematic cross-sectional views of the electronic device 10 shown in FIG. 1 and FIG. 3, respectively.

Please refer to FIGS. 1 to 4, the electronic device 10 may include a display screen 120 and an optical fingerprint module 130.

The display screen 120 may be a self-light-emitting display screen that adopts a self-light-emitting display unit as a display pixel. For example, the display screen 120 may be an organic light-emitting diode (OLED) display screen or a micro light-emitting diode (Micro-LED) display screen. In other alternative embodiments, the display screen 120 may also be a liquid crystal display (LCD) screen or other passive light-emitting display screens, which is not limited in the embodiments of the present application. Further, the display screen 120 may be specifically a touch display screen, which may not only display a screen but also detect a touch or press operation of a user, thereby providing the user with a human-machine interaction interface. For example, in an embodiment, the electronic device 10 may include a touch sensor, and the touch sensor may specifically be a touch panel (TP), which may be disposed on a surface of the display screen 120, or may be partially integrated or entirely integrated into an interior of the display screen 120 to form the touch display screen.

The optical fingerprint module 130 includes an optical fingerprint sensor including an optical sensing pixel array 133 (which may also be referred to as an optical sensing unit array, a photosensitive pixel array, a pixel unit array, etc.) having a plurality of optical sensing pixels 131 (which may also be referred to as optical sensing units, photosensitive pixels, pixel units, etc.). A region where the optical sensing pixel array 133 is located or a photosensitive region (also referred to as a sensing region) of the optical fingerprint module 130 corresponds to a fingerprint detection region 103 (also referred to as a fingerprint capturing region, a fingerprint identification region, or the like) of the optical fingerprint module 130.

It should be noted that each optical sensing pixel in the optical sensing pixel array may include a photosensitive region and a non-photosensitive region, where the photosensitive region may be provided with a device for converting a light signal into an electrical signal, such as a photodetector; and the non-photosensitive region may not be provided with a device that converts a light signal into an electrical signal, and the non-photosensitive region may be provided with at least one metal wiring layer to realize the transmission of an electrical signal from the photosensitive region to other devices.

Of course, at least one metal wiring layer for transmitting an electrical signal may also be provided on a surface of the photosensitive region that is unlikely to receive a light signal, which is not limited in the present application.

In other words, the optical sensing pixel 131 may include a photodetector, that is, the optical sensing pixel array 133 may specifically include a photodetector (Photo detector) array including a plurality of photodetectors distributed in an array.

The optical fingerprint module 130 is disposed in a partial region under the display screen 120.

Please continue to refer to FIG. 1, the fingerprint detection region 103 may be located within a display region of the display screen 120. In an alternative embodiment, the optical fingerprint module 130 may also be disposed at other positions, such as a side surface of the display screen 120 or an edge non-light transmitting region of the electronic device 10, and a light signal from at least part of the display region of the display screen 120 is directed to the optical fingerprint module 130 through a light path design, such that the fingerprint detection region 103 is actually located in the display region of the display screen 120.

For the electronic device 10, when a user needs to unlock the electronic device 10 or perform other fingerprint verification, a fingerprint input can be implemented merely by pressing a finger on the fingerprint detection region 103 in the display screen 120. Since fingerprint detection can be implemented in the screen, there is no need to exclusively reserve space for a front surface of the electronic device 10 adopting the foregoing structure to set a fingerprint button (such as a Home button), so that a full screen solution may be adopted, that is, the display region of the display screen 120 may be substantially extended to an entire front surface of the electronic device 10.

Please continue to refer to FIG. 2, the optical fingerprint module 130 may include a light detecting portion 134 and an optical component 132. The light detecting portion 134 includes an optical fingerprint sensor (which may also be referred to as the optical sensing pixel array 133) and a readout circuit and other auxiliary circuits electrically connected to the optical sensing pixel array 133, and may be fabricated on a die (Die) by a semiconductor process, such as an optical imaging chip or an optical fingerprint sensor. The optical component 132 may be disposed above the optical sensing pixel array 133 of the light detecting portion 134, and may specifically include a filter (Filter) layer, a light directing layer or a light path directing structure, and other optical elements. The filter layer may be configured to filter out ambient light passing through a finger, and the light directing layer or the light path directing structure is mainly configured to direct reflected light reflected from a finger surface to the optical sensing pixel array 133 for optical detection.

In some embodiments of the present application, the optical component 132 and the light detecting portion 134 may be encapsulated in the same optical fingerprint component. For example, the optical component 132 and the light detecting portion 134 may be encapsulated in the same optical fingerprint chip, or the optical component 132 may be disposed outside a chip where the light detecting portion 134 is located, for example, the optical component 132 is attached above the chip, or some of elements of the optical component 132 are integrated into the chip.

In some embodiments of the present application, a region where the optical sensing pixel array 133 of the optical fingerprint module 130 is located or a light sensing range thereof corresponds to the fingerprint detection region 103 of the optical fingerprint module 130. An area of the fingerprint detection region 103 of the optical fingerprint module 130 may or may not be equal to an area of the region where the optical sensing pixel array 133 of the optical fingerprint module 130 is located or the optical sensing range thereof, which is not specifically limited in the embodiment of the present application.

For example, if the light path is directed in a manner of light collimation, the area of the fingerprint detection region 103 of the optical fingerprint module 130 may be designed to be substantially identical with the area of the optical sensing pixel array 133 of the optical fingerprint module 130.

For another example, the area of the fingerprint detection region 103 of the optical fingerprint module 130 may be larger than the area of the optical sensing pixel array 133 of the optical fingerprint module 130 through a lens imaging light path design, a reflective folding light path design or other light path designs such as light convergence or reflection for example.

Hereinafter, the light path directing structure that the optical component 132 may include is exemplarily illustrated.

In an example that the light path directing structure adopts an optical collimator having an array of through holes with a high aspect ratio, the optical collimator may be specifically a collimator layer fabricated on a semiconductor silicon wafer, which has a plurality of collimating units or micro pores, and the collimating unit may be a small hole. Light in reflected light reflected from a finger that is vertically incident to the collimating unit may pass through sensor chips and be received by the sensor chips below it. However, light with an excessively large incident angle is attenuated through multiple reflection inside the collimating unit, and therefore each sensor chip may basically only receive the reflected light reflected from fingerprint lines right above the sensor chip, which can effectively improve image resolution and further improve a fingerprint identification effect.

In an example of a light path design that the light path directing structure adopts an optical lens, the light path directing structure may be an optical lens layer having one or more lens units, for example, a lens group composed of one or more aspheric lenses, for converging reflected light reflected from a finger to the optical sensing pixel array 133 of the light detecting portion 134 below it, so that the optical sensing pixel array 133 may perform imaging based on the reflected light so as to obtain a fingerprint image of the finger. Further, the optical lens layer may be further provided with a pinhole or a micro-hole diaphragm formed in a light path of the lens unit. For example, one or more light shielding sheets may be formed in the light path of the lens unit, where at least one light shielding sheet may be provided with a light-transmitting micro-hole formed in an optical axis or an optical center region of the lens unit, and the light-transmitting micro-hole may serve as the foregoing pinhole or micro-hole diaphragm. The pinhole or the micro-hole diaphragm may cooperate with the optical lens layer and/or other optical film layers above the optical lens layer to expand the field of view of the optical fingerprint module 130 so as to improve a fingerprint imaging effect of the optical fingerprint module 130.

In an example of a light path design that the light path directing structure adopts a micro-lens layer, the light path directing structure may be a micro-lens array composed of a plurality of micro-lenses, which may be formed above the optical sensing pixel array 133 of the light detecting portion 134 by a semiconductor growth process or other processes, and each micro-lens may correspond to one of sensing units in the optical sensing pixel array 133 respectively. Moreover, other optical film layers such as a medium layer or a passivation layer may be further formed between the micro-lens layer and the sensing unit. More specifically, a light shielding layer (or referred to as a light blocking layer, a light resisting layer, etc.) having a micro-hole (or referred to as a hole) may be further included between the micro-lens layer and the sensing unit, where the micro-hole is formed between the micro-lens and the sensing unit corresponding thereto, and the light shielding layer may shield optical interference between adjacent micro-lenses and sensing units, such that light corresponding to the sensing unit is converged to the interior of the micro-hole through the micro-lens and is transmitted to the sensing unit via the micro-hole to perform optical fingerprint imaging.

It should be understood that several implementation solutions of the foregoing light path directing structure may be used alone or in combination.

For example, the micro-lens layer may be further disposed above or below the collimator layer or the optical lens layer. Certainly, when the collimator layer or the optical lens layer is used in combination with the micro-lens layer, the specific laminated structure or light path may need to be adjusted according to actual requirements.

On the other hand, the optical component 132 may also include other optical elements, for example, a filter layer or other optical films, which may be disposed between the light path directing structure and the optical fingerprint sensor or between the display screen 120 and the light path directing structure, and are mainly configured to isolate the impact of external interference light on optical fingerprint detection. The filter layer may be configured to filter out ambient light that penetrates a finger and enters into the optical fingerprint sensor via the display screen 120. Similar to the light path directing structure, the filter layer may be respectively configured for each of the optical fingerprint sensors to filter out interfering light, or a large area of filter layer may be adopted to cover the plurality of optical fingerprint sensors simultaneously.

The optical fingerprint module 130 may be configured to capture fingerprint information (such as fingerprint image information) of a user.

In an example that the display screen 120 adopts a display screen having a self-light-emitting display unit, for example, an organic light-emitting diode (OLED) display screen or a micro light-emitting diode (Micro-LED) display screen, the optical fingerprint module 130 may utilize a display unit (that is, an OLED light source) of the OLED display screen 120 located in the fingerprint detection region 103 as an excitation light source for optical fingerprint detection. When a finger 140 is pressed against the fingerprint detection region 103, the display screen 120 emits a beam of light 111 to the target finger 140 above the fingerprint detection region 103, and the light 111 is reflected by a surface of the finger 140 to form reflected light or form scattered light (transmitted light) after scattering inside the finger 140. In related patent applications, the reflected light and the scattered light are collectively referred to as reflected light for convenience of description. Since a ridge 141 and a valley 142 of a fingerprint have different light reflecting capabilities, reflected light 151 from the ridge of the fingerprint and reflected light 152 from the valley of the fingerprint have different light intensities. After passing through the optical component 132, the reflected light is received by the optical sensing pixel array 133 in the optical fingerprint module 130 and converted into a corresponding electrical signal, that is, a fingerprint detection signal; and fingerprint image data can thus be obtained based on the fingerprint detection signal, and fingerprint matching verification may be further performed, thereby implementing an optical fingerprint identification function in the electronic device 10.

In other alternative solutions, the optical fingerprint module 130 may also adopt an internal light source or an external light source to provide a light signal for fingerprint detection and identification. In this case, the optical fingerprint module 130 can be applied not only to a self-light-emitting display screen such as an OLED display screen, but also to a non-self-light-emitting display screen such as a liquid crystal display screen or other passive light-emitting display screens.

In an example that a liquid crystal display screen having a backlight module and a liquid crystal panel is applied, in order to support under-screen fingerprint detection of the liquid crystal display screen, an optical fingerprint system of the electronic device 10 may further include an excitation light source for optical fingerprint detection. The excitation light source may specifically be an infrared light source or a light source of non-visible light with a specific wavelength, which may be disposed below the backlight module of the liquid crystal display screen or disposed in an edge region under a protective cover of the electronic device 10. The optical fingerprint module 130 may be disposed below the liquid crystal panel or the edge region of the protective cover, and by being directed over a light path, light for fingerprint detection may reach the optical fingerprint module 130. Alternatively, the optical fingerprint module 130 may also be disposed below the backlight module, and the backlight module allows the light for fingerprint detection to pass through the liquid crystal panel and the backlight module and reach the optical fingerprint module 130 by providing a hole on film layers such as a diffusion sheet, a brightening sheet, a reflection sheet or the like, or by performing other optical designs. When the optical fingerprint module 130 adopts an internal light source or an external light source to provide a light signal for fingerprint detection, a detection principle thereof is consistent with the foregoing description.

In a specific implementation, the electronic device 10 may further include a transparent protective cover, and the cover may be a glass cover or a sapphire cover, which is located above the display screen 120 and covers a front surface of the electronic device 10. Therefore, in an embodiment of the present application, the so-called the finger being pressed against the display screen 120 actually refers to the finger being pressed against a cover above the display screen 120 or a surface of a protective layer covering the cover.

On the other hand, the optical fingerprint module 130 may only include one optical fingerprint sensor, and in this case, the fingerprint detection region 103 of the optical fingerprint module 130 has a smaller area and a fixed position. Therefore, when a fingerprint input is performed, a user needs to press a finger at a specific position of the fingerprint detection region 103, otherwise the optical fingerprint module 130 may not be able to capture a fingerprint image, thereby resulting in poor user experience. In other alternative embodiments, the optical fingerprint module 130 may specifically include a plurality of optical fingerprint sensors. The plurality of optical fingerprint sensors may be disposed below the display screen 120 side by side in a splicing manner, and fingerprint detection regions of the plurality of optical fingerprint sensors collectively constitute the fingerprint detection region 103 of the optical fingerprint module 130. Thus the fingerprint detection region 103 of the optical fingerprint module 130 may be extended to a main region of a lower half part of the display screen, that is, to a customary pressing region of a finger, thereby implementing a blind-press type of fingerprint input operation. Further, when the number of the optical fingerprint sensors is sufficient, the fingerprint detection region 103 may also be extended to a half of the display region or even the entire display region, thereby implementing half-screen or full-screen fingerprint detection.

Please refer to FIG. 3 and FIG. 4, an optical fingerprint module 130 in the electronic device 10 may include a plurality of optical fingerprint sensors, and the plurality of optical fingerprint sensors may be disposed below the display screen 120 side by side in a splicing manner or the like for example, and fingerprint detection regions of the plurality of optical fingerprint sensors collectively constitute the fingerprint detection region 103 of the optical fingerprint module 130.

Further, the optical component 132 may include a plurality of light path directing structures, and each light path directing structure respectively corresponds to one optical fingerprint sensor (that is, an optical sensing pixel array 133) and is respectively attached to be disposed above the corresponding optical fingerprint sensor. Alternatively, the plurality of optical fingerprint sensors may also share one entire light path directing structure, that is, the light path directing structure has an area large enough to cover optical sensing pixel arrays 133 of the plurality of optical fingerprint sensors.

In an example that the optical component 132 adopts an optical collimator having an array of through holes with a high aspect ratio, when the optical fingerprint module 130 includes a plurality of optical fingerprint sensors, one or more collimating units may be configured for one optical sensing pixel in an optical sensing pixel array 133 of each optical fingerprint sensor, and attached to be disposed above the corresponding optical sensing pixel. Of course, the plurality of optical sensing pixels may also share one collimating unit, that is, the one collimating unit has an aperture large enough to cover the plurality of optical sensing pixels. That is, one collimating unit may correspond to a plurality of optical sensing pixels or one optical sensing pixel may correspond to a plurality of collimating units, which breaks a correspondence between a spatial period of the display screen 120 and a spatial period of the optical fingerprint sensor. Therefore, even if a spatial structure of a light emitting display array of the display screen 120 is similar to a spatial structure of the optical sensing pixel array 133 of the optical fingerprint sensor, generation of Moiré fringes could be effectively avoided when the optical fingerprint module 130 utilizes a light signal passing through the display screen 120 to perform fingerprint imaging, thereby effectively improving a fingerprint identification effect of the optical fingerprint module 130.

In an example that the optical component 132 adopts an optical lens, when the optical fingerprint module 130 includes a plurality of sensor chips, one optical lens may be configured for each of the sensor chips for fingerprint imaging, or one optical lens may be configured for the plurality of sensor chips to implement light convergence and fingerprint imaging. Even when one sensor chip has dual optical sensing pixel arrays (Dual Array) or multiple optical sensing pixel arrays (Multi-Array), two or more optical lenses may be configured for this sensor chip to cooperate with the dual optical sensing pixel arrays or multiple optical sensing pixel arrays for optical imaging, so as to reduce an imaging distance and enhance an imaging effect.

It should be understood that FIGS. 1 to 4 are only examples of the present application and should not be understood as limitation on the present application.

For example, the present application does not specifically limit the number, sizes, and arrangement of the fingerprint sensors, which can be adjusted according to actual needs. For example, the optical fingerprint module 130 may include a plurality of fingerprint sensors distributed in a square or circular shape.

It should be noted that, assuming that the optical directing structure included in the optical component 132 is an optical collimator or a micro-lens array, the effective field of view of the optical sensing pixel array 133 of the optical fingerprint module 130 may be limited by the area of the optical component 132.

Figure 5:
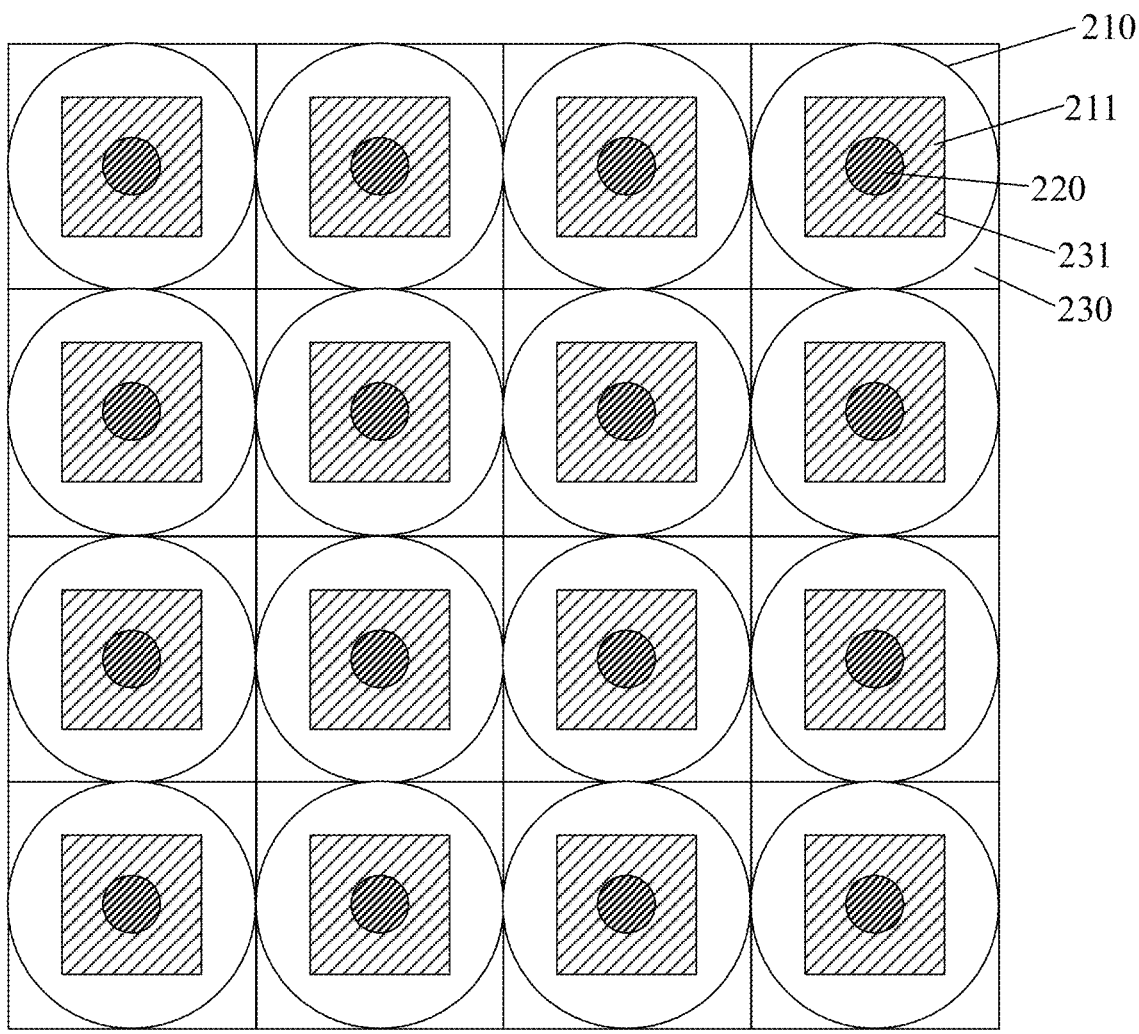
FIG. 5 is a schematic block diagram of a fingerprint detection apparatus according to the present application.

By taking a micro-lens array as an example, as shown in FIG. 5, the micro-lens array is located directly above an optical sensing pixel array, and one micro-lens 210 corresponds to one optical sensing pixel 230, that is, each micro-lens 210 in the micro-lens array focuses received light to an optical sensing pixel 230 corresponding to the same micro-lens 210 through a hole 220 of a light shielding plate. In a top view, optical sensing pixels 230 in the optical sensing pixel array are periodically arranged, and a photosensitive region 231 of each optical sensing pixel 230 in the optical sensing pixel array is disposed in a center position of the same optical sensing pixel to improve the duty cycle of the photosensitive region.

In other words, the micro-lens 210 and the optical sensing pixel 230 are in one-to-one correspondence, and photosensitive regions 231 of the optical sensing pixels 230 in the optical sensing pixel array are periodically arranged and uniformly distributed.

However, the photosensitive regions of the optical sensing pixel array are affected by the size of the micro-lens array, and a thickness of an optical fingerprint module is relatively large, which further increases the processing difficulty, cycle and cost of a light path of the optical fingerprint module.

Therefore, how to reduce the thickness of the optical fingerprint module on the basis of increasing a fingerprint identification region has become an urgent technical problem to be solved.

A fingerprint detection apparatus according to an embodiment of the present application is applied under a display screen, and can implement under-screen optical fingerprint detection. The fingerprint detection apparatus may be applied to the electronic device 10 shown in FIGS. 1 to 4, or the apparatus may be the optical fingerprint module 130 shown in FIGS. 1 to 4. As shown in FIG. 5, the fingerprint detection apparatus includes a plurality of fingerprint detection units 20.

It should be understood that the fingerprint detection apparatus may include a plurality of fingerprint detection units distributed in an array or disposed alternately, and may also include a plurality of fingerprint detection units distributed in a centrally symmetrical or axially symmetrical manner, which is not specifically limited in the embodiment of the present application.

For example, the fingerprint detection apparatus may include a plurality of fingerprint detection units that are independently configured in structure but disposed alternately in arrangement. For example, two adjacent columns or rows of fingerprint detection units in the fingerprint detection apparatus are disposed alternately.

Of course, the fingerprint detection apparatus may also include a plurality of fingerprint detection units alternate to each other in structure. For example, a micro-lens in each fingerprint detection unit in the fingerprint detection apparatus may converge a received oblique light signal to optical sensing pixels below micro-lenses in a plurality of adjacent fingerprint detection units. In other words, each micro-lens converges a received oblique light signal to optical sensing pixels below a plurality of micro-lenses adjacent to the same micro-lens.

Each of the plurality of fingerprint detection units includes: a plurality of optical sensing pixels, one micro-lens, and at least one light shielding layer.

In a specific implementation, the one micro-lens may be disposed above the plurality of optical sensing pixels, or the plurality of optical sensing pixels may be respectively disposed below the plurality of micro-lenses adjacent to the one micro-lens. For example, the one micro-lens is disposed above a center position of the plurality of optical sensing pixels. The at least one light shielding layer may be disposed between the one micro-lens and the plurality of optical sensing pixels, and each of the at least one light shielding layer is provided with a hole corresponding to the plurality of optical sensing pixels. After being converged by the one micro-lens, oblique light signals in multiple directions reflected from a finger above the display screen are respectively transmitted to the plurality of optical sensing pixels through the hole provided in the at least one light shielding layer, and the oblique light signals are used to detect fingerprint information of the finger.

For example, the multiple directions of the oblique light signals may include an incident direction of an oblique light that can be converged by the one micro-lens, and may also include an incident direction of an oblique light that can be converged by the micro-lens array of the fingerprint detection apparatus. For example, in the top view, the oblique light signals in the multiple directions may be light signals in up, down, left, and right directions received by the one micro-lens, and the light signals in the four directions are respectively converged to photosensitive regions of four optical sensing pixels below the one micro-lens. Included angles of the light signals in the four directions relative to a plane where the display screen is located may be the same or different. The multiple directions may be directions in terms of the plane where the display screen is located, or directions in terms of a three-dimensional space. The multiple directions may be different from each other, may be partially different, or may be all the same.

The micro-lens may be various lenses having a converging function to increase a field of view and increase the amount of light signals transmitted to a photosensitive pixel. A material of the micro-lens may be an organic material such as resin.

The optical sensing pixel may be a photo-sensor configured to convert a light signal into an electrical signal. Optionally, the optical sensing pixel may adopt a complementary metal oxide semiconductor (CMOS) device, that is, a semiconductor device composed of a PN junction, and has unidirectional conductivity characteristics. Optionally, the optical sensing pixel has a light sensitivity greater than a first predetermined threshold and a quantum efficiency greater than a second predetermined threshold for blue light, green light, red light, or infrared light. For example, the first predetermined threshold may be 0.5 v/lux-sec and the second predetermined threshold may be 40%. That is, the optical sensing pixel has a high light sensitivity and a high quantum efficiency for blue light (having a wavelength of $460\pm30$ nm), green light (having a wavelength of $540\pm30$ nm), red light or infrared light (having a wavelength greater than or equal to 610 nm) to facilitate detection of the corresponding light.

It should be understood that the present application does not limit the specific shapes of the micro-lens and the optical sensing pixels. For example, each of the plurality of optical sensing pixels may be a polygonal pixel such as a quadrilateral or hexagonal pixel, or may be a pixel of other shapes such as a circular pixel, so that the plurality of optical sensing pixels have higher symmetry, higher sampling efficiency, an equal distance between adjacent pixels, better angular resolution, and less aliasing effects.

It should also be understood that the above parameters of the optical sensing pixels may correspond to light for fingerprint detection. For example, if the light for fingerprint detection is only light with a wavelength band, the above parameters of the optical sensing pixels only need to meet requirements of the light with the wavelength band.

In the present application, signals received by the plurality of optical sensing pixels are oblique light signals in multiple directions, that is, light signals in multiple directions that are incident obliquely.

When a dry finger fingerprint is not in good contact with an OLED screen, a contrast between a fingerprint ridge and a fingerprint valley of a fingerprint image in a vertical direction is poor, and the image is so blurred that fingerprint lines cannot be distinguished. In the present application, a light path is reasonably designed to allow an oblique light signal to be received in the light path, which can better detect the fingerprint image of the dry finger while better obtaining normal finger fingerprints. In normal life scenes, such as washing hands, getting up in the morning, plastering fingers, low temperature and other scenes, fingers are usually dry and stratum corneum is uneven. When the fingers are pressed on an OLED screen, a poor contact will occur in local regions of the fingers. The occurrence of this situation causes the current optical fingerprint solution to have a poor fingerprint identification effect on a dry finger. The beneficial effect of the present application is to improve a fingerprint imaging effect on the dry finger and make the fingerprint image of the dry finger clear.

In addition, the oblique light signals in the multiple directions can be subjected to non-frontal light imaging (i.e., oblique light imaging) through the one micro-lens, which can shorten the thickness of a light path design layer between the one micro-lens and the optical sensing pixel array, and in turn, can effectively reduce the thickness of the fingerprint detection apparatus.

At the same time, by imaging oblique light signals in multiple directions, an object-side numerical aperture of an optical system can be enlarged, thereby improving the robustness and tolerability of a tolerance of the fingerprint detection apparatus. The numerical aperture can be used to measure the angular range of light that can be collected by the one micro-lens. In other words, the plurality of optical sensing pixels can also expand a field angle and a field of view of the fingerprint detection unit by receiving the light signals in the multiple directions, thereby increasing a field angle and a field of view of the fingerprint detection apparatus. For example, the field of view of the fingerprint detection apparatus can be expanded from $6\times9$ mm$^2$ to $7.5\times10.5$ mm$^2$ to further improve a fingerprint identification effect.

Moreover, by arranging a plurality of optical sensing pixels under the one micro-lens, a spatial period of micro-lenses (that is, a spacing between adjacent micro-lenses) and a spatial period of the optical sensing pixels (that is, a spacing between adjacent optical sensing pixels) are not equal, which can avoid Moiré fringes in a fingerprint image and improve a fingerprint identification effect, thereby reducing the cost of the lens and increasing the density of the plurality of optical sensing pixels, and further reducing the size and cost of the fingerprint detection apparatus.

At the same time, a single fingerprint detection unit can multiplex light signals from multiple angles (for example, a single micro-lens can multiplex light signals from four angles), which can split and image light beams with different object-side aperture angles, increase the amount of light entering the fingerprint detection apparatus effectively, and further reduce exposure time of the optical sensing pixels.

Moreover, since the plurality of optical sensing pixels can respectively receive oblique light signals from multiple directions, the plurality of optical sensing pixels can be divided into a plurality of optical sensing pixel groups according to the directions of the oblique light signals. The plurality of optical sensing pixel groups may be respectively configured to receive the oblique light signals in the multiple directions, that is, each optical sensing pixel group may generate a fingerprint image based on the received oblique light signal, so that the plurality of optical sensing pixel groups can be configured to generate multiple fingerprint images. In this case, the multiple fingerprint images can be superimposed to obtain a high-resolution fingerprint image, and further fingerprint identification is performed based on the high-resolution fingerprint image, which can improve fingerprint identification performance.

Based on the above analysis, it can be seen that after being converged by the one micro-lens, oblique light signals in multiple directions reflected from a finger above the display screen are respectively transmitted to the plurality of optical sensing pixels through the hole provided in the at least one light shielding layer, which can not only reduce exposure time of the plurality of optical sensing pixels, as well as the thickness and cost of the fingerprint detection apparatus, but also improve the robustness, tolerability of a tolerance, field angle, and field of view of the fingerprint detection apparatus, thereby improving a fingerprint identification effect, especially a fingerprint identification effect on a dry finger.

In addition, a center position of a photosensitive region of each of the plurality of optical sensing pixels in the fingerprint detection unit is offset relative to a center position of the same optical sensing pixel.

In other words, a center position of a photosensitive region of each of the plurality of optical sensing pixels does not overlap a center position of the same optical sensing pixel. That is, photosensitive regions of the fingerprint detection apparatus are periodically arranged in a unit of fingerprint detection unit, rather than periodically arranged in a unit of optical sensing pixel.

A center position of a photosensitive region of each of the plurality of optical sensing pixels is offset relative to a center position of the same optical sensing pixel, which can increase an image distance of the one micro-lens in the case that a vertical distance between the one micro-lens and the plurality of optical sensing pixels is constant, and can further reduce the thickness of the fingerprint detection apparatus.

In other words, with respect to the fingerprint detection apparatus, the thickness of the fingerprint detection apparatus can be reduced as much as possible by receiving light signals at multiple oblique angles and offsetting the center position of the photosensitive region of the optical sensing pixel.

In some embodiments of the present application, a distance between a center position of each of the plurality of optical sensing pixels and a center position of the one micro-lens is less than a distance between a center position of a photosensitive region of the same optical sensing pixel and the center position of the one micro-lens.

In other words, a center position of a photosensitive region of each of the plurality of optical sensing pixels is offset relative to a center position of the same optical sensing pixel, which can increase a distance between the center position of the photosensitive region of each of the plurality of optical sensing pixels and the center position of the one micro-lens.

Therefore, an image distance of the one micro-lens can be increased in the case that a vertical distance between the one micro-lens and the plurality of optical sensing pixels is maintained unchanged.

In some embodiments of the present application, a light spot region is formed on the photosensitive region of each of the plurality of optical sensing pixels through the hole provided in the at least one light shielding layer, and a center position of the light spot region is offset by a first distance relative to a projection of a center position of the one micro-lens on a plane where the plurality of optical sensing pixels are located, and a connecting line between the center position of the one micro-lens and the center position of the light spot region forms a first included angle with a direction perpendicular to the display screen, and the first distance is inversely proportional to a cotangent of the first included angle.

The first included angle may be a refraction angle formed when light enters the fingerprint detection unit or a light path medium of the fingerprint detection unit from air, and the light path medium may include the one micro-lens and a transparent medium between the one micro-lens and the plurality of optical sensing pixels.

In other words, the first included angle may be an oblique incident angle in the fingerprint detection unit or the light path medium of the fingerprint detection unit.

That is, the first included angle may be an included angle between the oblique light signal transmitted in the fingerprint detection unit or the light path medium of the fingerprint detection unit with the direction perpendicular to the display screen.

As an example, the light spot region is smaller than the photosensitive region of each of the plurality of optical sensing pixels, and the light spot region is disposed on a side of the photosensitive region close to or away from the one micro-lens. Of course, the light spot region may also be set in the center position of the photosensitive region.

In some embodiments of the present application, a vertical distance between the one micro-lens and the plurality of optical sensing pixels is equal to a product of the cotangent of the first included angle and the first distance.

In other words, the vertical distance can be determined by a formula $h = x*\cot\theta$, where h is the vertical distance, x is the first distance, and $\theta$ is the first included angle. The vertical distance may also be referred to as a light path height of the fingerprint detection unit.

Therefore, it can be ensured that the one micro-lens images light signals returned via a finger to the plurality of optical sensing pixels so as to form a fingerprint image.

In other words, setting the vertical distance as the product of the cotangent of the first included angle and the first distance can make the one micro-lens image the oblique light signals in multiple directions to the offset photosensitive regions.

By taking a light signal with an oblique incident angle (that is, the first included angle) of 26° in the air as an example, it is assumed that parameters of the fingerprint detection unit in the fingerprint detection apparatus are as follows.

The plurality of optical sensing pixels are located below the one micro-lens, the plurality of optical sensing pixels are a rectangular array of 2×2 optical sensing pixels, each optical sensing pixel in the rectangular array of 2×2 optical sensing pixels is a rectangular pixel with a side length of 7.5 μm, and a center position of the photosensitive region of each optical sensing pixel in the rectangular array of 2×2 optical sensing pixels is 5 μm away from a center position of the 2×2 rectangular array of optical sensing pixels, and an oblique incident angle (that is, the first included angle) in a light path medium of the fingerprint detection unit is approximately 19°.

In this case, if the period of micro-lenses in the fingerprint detection apparatus is 15 μm and a micro-lens is offset from the center position of the photosensitive region, a thickness of a light path of the fingerprint detection unit is about 20 μm.

At the same time, if the period of micro-lenses in the fingerprint detection apparatus is 7.5 μm (that is, the micro-lens and the optical sensing pixel are in one-to-one correspondence), and a micro-lens is not offset from the center position of the photosensitive region, a thickness of a light path of the fingerprint detection unit needs to be 40 μm, and processing difficulty increases exponentially.

It can be seen that compared with the solution that the photosensitive regions are uniformly distributed, the fingerprint detection apparatus of the present application has a thinner light path thickness.

In a specific implementation, by adjusting at least one of an offset of the center position of the photosensitive region, the position of the spot region in the photosensitive region, the position of a bottom light shielding layer of the at least one light shielding layer, the setting position of the hole in the at least one light shielding layer, a radius of curvature of the micro-lens, and the light path height of the fingerprint detection unit, angles (that is, the first included angle) and directions of the oblique light signals to be received by the plurality of optical sensing pixels can be reasonably designed.

In some embodiments of the present application, the center position of the photosensitive region of each of the plurality of optical sensing pixels is offset in a direction away from or close to a center position of the plurality of optical sensing pixels relative to the center position of the same optical sensing pixel.

In other words, those skilled in the art can determine the first distance based on the first included angle and the vertical distance, and then determine positional relationships between the one micro-lens and the plurality of optical sensing pixels based on the first distance. For example, the plurality of optical sensing pixels are located below the one micro-lens. For another example, the plurality of optical sensing pixels are respectively located below a plurality of micro-lenses adjacent to the one micro-lens.

For example, the plurality of optical sensing pixels are disposed below the one micro-lens, and the center position of the photosensitive region of each of the plurality of optical sensing pixels is offset in a direction away from the center position of the plurality of optical sensing pixels relative to the center position of the same optical sensing pixel.

In other words, assuming that each of the plurality of optical sensing pixels is a rectangular pixel, after those skilled in the art determines the first distance based on the first included angle and the vertical distance, if the first distance is less than the length of an oblique side of the rectangular pixel, it indicates that the one micro-lens can converge the received oblique light signals to photosensitive regions of the plurality of optical sensing pixels below the one micro-lens.

In this case, an offset distance of the center position of the photosensitive region of each of the plurality of optical sensing pixels relative to the center position of the same optical sensing pixel can be determined by a formula $y=x-\frac{1}{2}L$, where y represents the offset distance. If y is a positive number, it indicates that the center position of the photosensitive region of each of the plurality of optical sensing pixels is offset in a direction away from center position of the plurality of optical sensing pixels relative to the center position of the same optical sensing pixel. If y is a negative number, it indicates that the center position of the photosensitive region of each of the plurality of optical sensing pixels is offset in a direction close to center position of the plurality of optical sensing pixels relative to the center position of the same optical sensing pixel.

Of course, the offset distance of the center position of the photosensitive region of each of the plurality of optical sensing pixels relative to the center position of the same optical sensing pixel can also be determined by a formula $y=x-\frac{1}{2}L-z$, where z represents an offset distance of a center position of a spot region relative to a center position of a sensing region. If z is a positive number, it indicates an offset distance of the center position of the spot region in a direction away from the center position of the plurality of optical sensing pixels relative to the center position of the sensing region. If z is a negative number, it indicates an offset distance of the center position of the spot region in a direction close to the center position of the plurality of optical sensing pixels relative to the center position of the sensing region.

For another example, the plurality of optical sensing pixels are respectively located below a plurality of micro-lenses adjacent to the one micro-lens, and the center position of the photosensitive region of each of the plurality of optical sensing pixels is offset in a direction away from or close to the center position of the plurality of optical sensing pixels relative to the center position of the same optical sensing pixel.

In other words, assuming that each of the plurality of optical sensing pixels is a rectangular pixel, after those skilled in the art determines the first distance based on the first included angle and the vertical distance, if the first distance is greater than the length of an oblique side of the rectangular pixel, it indicates that the one micro-lens can converge the received oblique light signals to photosensitive regions of optical sensing pixels below a plurality of micro-lenses adjacent to the one micro-lens.

In this case, an offset distance of the center position of the photosensitive region of each of the plurality of optical sensing pixels relative to the center position of the same optical sensing pixel can be determined by a formula $y=x-L$, where y represents the offset distance. If y is a positive number, it indicates that the center position of the photosensitive region of each of the plurality of optical sensing pixels is offset in a direction close to center position of the plurality of optical sensing pixels relative to the center position of the same optical sensing pixel. If y is a negative number, it indicates that the center position of the photosensitive region of each of the plurality of optical sensing pixels is offset in a direction away from center position of the plurality of optical sensing pixels relative to the center position of the same optical sensing pixel.

Of course, the offset distance of the center position of the photosensitive region of each of the plurality of optical sensing pixels relative to the center position of the same optical sensing pixel can also be determined by a formula y=x−L−z, where z represents an offset distance of a center position of a spot region relative to a center position of a sensing region. If z is a positive number, it indicates an offset distance of the center position of the spot region in a direction close to the center position of the plurality of optical sensing pixels relative to the center position of the sensing region. If z is a negative number, it indicates an offset distance of the center position of the spot region in a direction away from the center position of the plurality of optical sensing pixels relative to the center position of the sensing region.

For example, the center position of the photosensitive region of each of the plurality of optical sensing pixels is offset along a diagonal line of the same optical sensing pixel so that the center position of the photosensitive region of each of the plurality of optical sensing pixels is located on the diagonal line of the same optical sensing pixel.

In an example that the plurality of optical sensing pixels are a rectangular array of 2×2 optical sensing pixels, four photosensitive regions of the rectangular array of 2×2 optical sensing pixels may be distributed on four corners of the rectangular array of 2×2 optical sensing pixels.

For another example, the center position of the photosensitive region of each of the plurality of optical sensing pixels is offset along a side length of the same optical sensing pixel so that a connecting line of the center position of the photosensitive region of each of the plurality of optical sensing pixels and the center position of the same optical sensing pixel is parallel to the side length of the same optical sensing pixel.

In an example that the plurality of optical sensing pixels are a rectangular array of 2×2 optical sensing pixels, four photosensitive regions of the rectangular array of 2×2 optical sensing pixels may be distributed on four sides of the rectangular array of 2×2 optical sensing pixels.

In some embodiments of the present application, the center position of the photosensitive region of each of the plurality of optical sensing pixels is offset by a first distance relative to the center position of the same optical sensing pixel, each of the plurality of optical sensing pixels is a rectangular pixel, and the first distance is less than or equal to a side length P of the rectangular pixel. For example, the first distance ranges from P/10 to P/2.

In some embodiments of the present application, an included angle of an oblique light signal in each of the multiple directions relative to the display screen ranges from 10 degrees to 60 degrees. For example, included angles of the oblique light signals in the multiple directions relative to the display screen are the same.

In other words, the range of an oblique incident angle in the air may be 10 degrees to 60 degrees.

In some embodiments of the present application, the at least one light shielding layer is a plurality of light shielding layers, and a bottom light shielding layer of the plurality of light shielding layers is provided with a plurality of holes corresponding to the plurality of optical sensing pixels respectively, so that the one micro-lens converges the oblique light signals in the multiple directions to the photosensitive regions of the plurality of optical sensing pixels respectively through the plurality of holes. A top light shielding layer of the plurality of light shielding layers is provided with at least one hole corresponding to the plurality of optical sensing pixels. For example, a hole may be provided in the top light shielding layer for each of the plurality of optical sensing pixels. For another example, a hole may be provided in the top light shielding layer for at least two of the plurality of optical sensing pixels.

For example, apertures of the holes in the plurality of light shielding layers corresponding to the same optical sensing pixel are sequentially decreased from top to bottom.

In other words, an aperture of a hole in an upper light shielding layer is set to be larger than an aperture of a hole in a lower light shielding layer, so that the plurality of light shielding layers can direct more light signals (within a certain angle range) to the corresponding photosensitive pixels.

For another example, a metal wiring layer of the plurality of optical sensing pixels is disposed at a back focal plane position of the one micro-lens, and the metal wiring layer is respectively provided with a plurality of holes above the photosensitive regions of plurality of optical sensing pixels to form the bottom light shielding layer of the plurality of light shielding layers.

In other words, a hole corresponding to a photosensitive region of each optical sensing pixel is formed on a metal wiring layer of a fingerprint sensor chip to form a bottom light shielding layer of the plurality of light shielding layers. That is, the metal wiring layer of the fingerprint sensor chip can be multiplexed as a light path layer between the micro-lens and the optical sensing pixel.

In an example that the at least one light shielding layer is two to three layers of diaphragms, there are four optical sensing pixels (such as photodiode pixels) below one micro-lens, and a center of a photosensitive region (Active Area, AA) of each optical sensing pixel has a certain offset relative to a center position of the same optical sensing pixel. Through a reasonable combination of the diaphragms, the one micro-lens unit can be allowed to simultaneously receive light signals in four oblique directions and converge the light signals to the four optical sensing pixels respectively.

In some other embodiments of the present application, the at least one light shielding layer is one light shielding layer, and the one light shielding layer is provided with a plurality of oblique holes corresponding to the plurality of optical sensing pixels respectively, so that the one micro-lens converges the oblique light signals in the multiple directions to the photosensitive regions of the plurality of optical sensing pixels respectively through the plurality of oblique holes.

For example, a thickness of the one light shielding layer is greater than or equal to a preset thickness, so that the plurality of oblique holes are respectively configured to transmit the oblique light signals in the multiple directions, and crosstalk of the oblique light signals transmitted through the plurality of oblique holes can be avoided.

It should be understood that, in a specific implementation, those skilled in the art can determine an oblique angle of each of the plurality of oblique holes according to the requirements of a light path design, and the plurality of oblique holes may be a plurality of oblique holes with different oblique angles, or oblique holes with partially or all the same oblique angles. Directions of the plurality of oblique holes may be directions of light signals expected to be received by optical sensing pixels after being converged by the micro-lens.

In a specific implementation, a transmittance of each light shielding layer in the at least one light shielding layer to light with a specific wavelength band (such as visible light or a wavelength band above 610 nm) is less than a preset threshold (such as 20%) to avoid the corresponding light to pass. The holes may be cylindrical through holes, or through holes of other shapes, such as polygonal through holes. An aperture of the hole may be greater than a predetermined value, for example, the aperture of the hole is greater than 100 nm so as to transmit desired light for imaging. The aperture of the hole shall be also less than a predetermined value to ensure that the light shielding layer can shield undesired light. For another example, the aperture of the hole may be smaller than a diameter of the micro-lens.

As an example, the hole in the at least one light shielding layer may also include a hole with a large aperture that is equivalently synthesized by a plurality of holes with small apertures. For example, the plurality of holes with small apertures may be a plurality of holes corresponding to the plurality of optical sensing pixels, respectively. For example, a plurality of holes with small apertures in the top light shielding layer for transmitting light signals converged by the same micro-lens in the at least one light shielding layer may be combined into one hole with a large aperture.

For example, each light shielding layer in the at least one light shielding layer may be a metal layer, and correspondingly, a hole provided in the light shielding layer may be a through hole formed in the metal layer. The light shielding layer in the at least one light shielding layer may also be a black polymer light-absorbing material. For example, for a light signal at an angle greater than a preset angle, the at least one light shielding layer has a transmittance less than 2% for a visible light waveband.

It should be understood that parameter setting of the hole should be made to allow a light signal required for imaging to be maximally transmitted to an optical sensing pixel as far as possible, while unnecessary light is shielded to the maximum. For example, a parameter of the hole may be set such that a light signal obliquely incident at a specific angle (for example, 35 degrees) is maximally transmitted to the corresponding optical sensing pixel, while other light signals are shielded to the maximum.

In some embodiments of the present application, the fingerprint detection apparatus may further include a transparent medium layer.

The transparent medium layer is configured to connect the one micro-lens, the at least one light shielding layer and the plurality of optical sensing pixels.

For example, the transparent medium layer can transmit a light signal with a target wavelength band (that is, a light signal with a wavelength band required for fingerprint detection). For example, the transparent medium layer may be made of an oxide or a nitride. Optionally, the transparent medium layer may be in multiple layers to implement functions such as protection, transition, and buffering, respectively. For example, a transition layer may be provided between an inorganic layer and an organic layer to achieve tight connection; and a protective layer may be provided on an easily oxidized layer to achieve protection.

In some embodiments of the present application, the fingerprint detection apparatus may further include a filter layer.

The filter layer is disposed in light paths between the one micro-lens and the plurality of optical sensing pixels or above the one micro-lens, and the filter layer is configured to filter out a light signal with a non-target wavelength band and transmit a light signal with a target wavelength band.

For example, a transmittance of the filter layer to light with a target wavelength band may be greater than or equal to a preset threshold, and a cut-off rate for light with a non-target wavelength band may be greater than or equal to the preset threshold. For example, the preset threshold may be 80%. Optionally, the filter layer may be an independently formed filter layer. For example, the filter layer may be a filter layer formed by using blue crystal or blue glass as a carrier. Optionally, the filter layer may be a coating formed on a surface of any layer in the light paths. For example, a coating film may be formed on a surface of the optical sensing pixel, a surface of any layer of the transparent medium layer, or a surface of the micro-lens to form the filter layer.

Hereinafter, by taking the plurality of optical sensing pixels as a rectangular array of 2×2 optical sensing pixels as an example, a fingerprint detection unit according to embodiments of the present application will be introduced with reference to FIGS. 6 to 9. The one micro-lens is disposed directly above the rectangular array of 2×2 optical sensing pixels.

Figure 6:
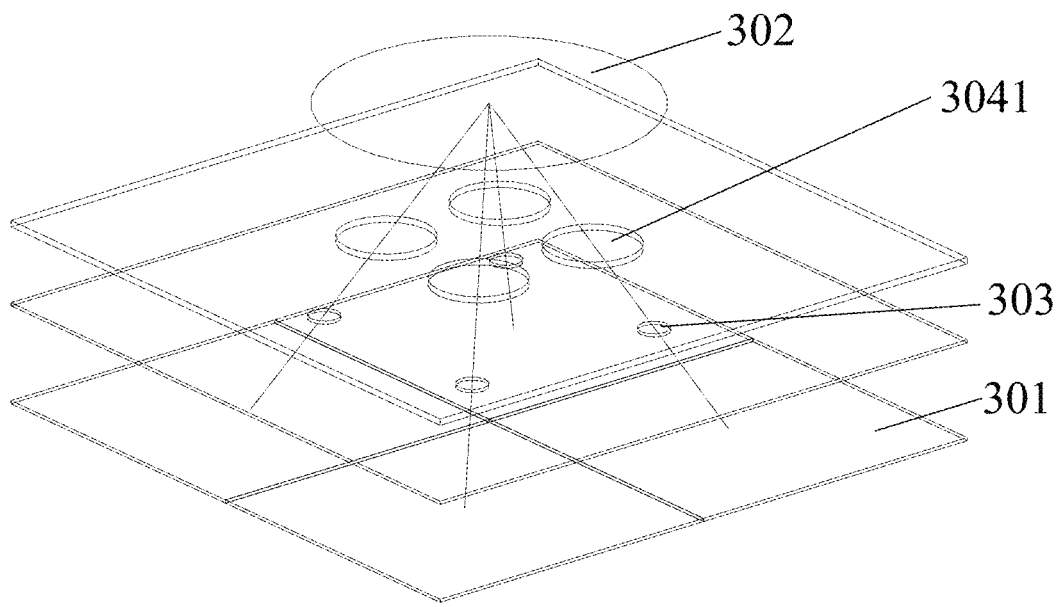
FIGS. 6 to 9 are schematic block diagrams of a fingerprint detection unit according to embodiments of the present application.

For example, as shown in FIG. 6, the fingerprint detection units 30 may include one micro-lens 302 and four optical sensing pixels 301 distributed in a rectangular array.

In a specific implementation, the at least one light shielding layer in the fingerprint detection units 30 may be respectively provided with a hole corresponding to the four optical sensing pixels 301 below the one micro-lens so that the one micro-lens may receive oblique light signals in multiple directions along a diagonal direction of the rectangular array of 2×2 optical sensing pixels, and the one micro-lens can converge the oblique light signals in the multiple directions to the optical sensing pixels in the rectangular array of 2×2 optical sensing pixels respectively along the diagonal direction to increase the amount of signals that each optical sensing pixel can receive, thereby improving a fingerprint identification effect.

Figure 7:
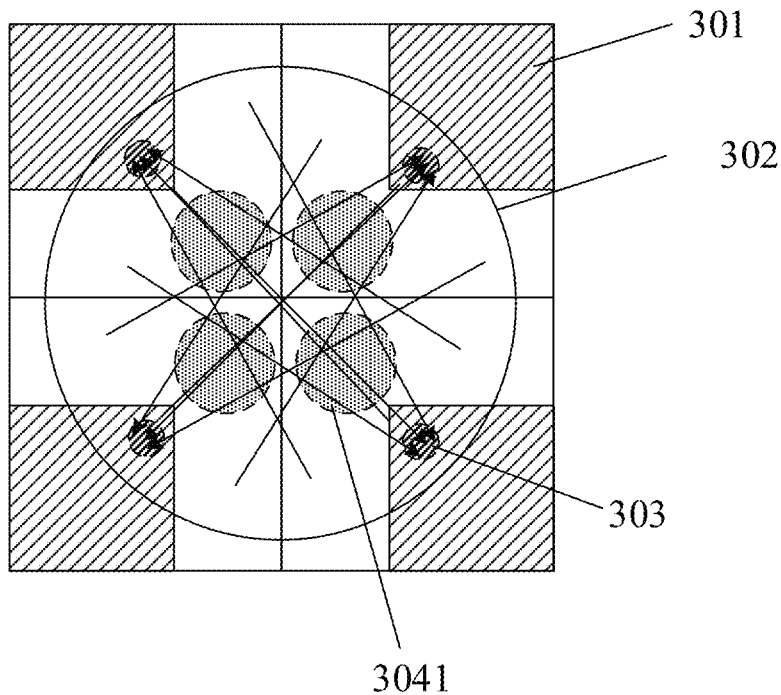

For example, as shown in FIG. 7, the at least one light shielding layer may include a top light shielding layer and a bottom light shielding layer. The top light shielding layer is provided with holes 3041 corresponding to the four optical sensing pixels 301 respectively below the one micro-lens 302, and the bottom light shielding layer is provided with holes 303 corresponding to the four optical sensing pixels 301 respectively below the one micro-lens 302. The one micro-lens 302 converges the received light signals in multiple directions to the four optical sensing pixels 301 respectively through the corresponding holes 3041 and holes 303.

Figure 8:
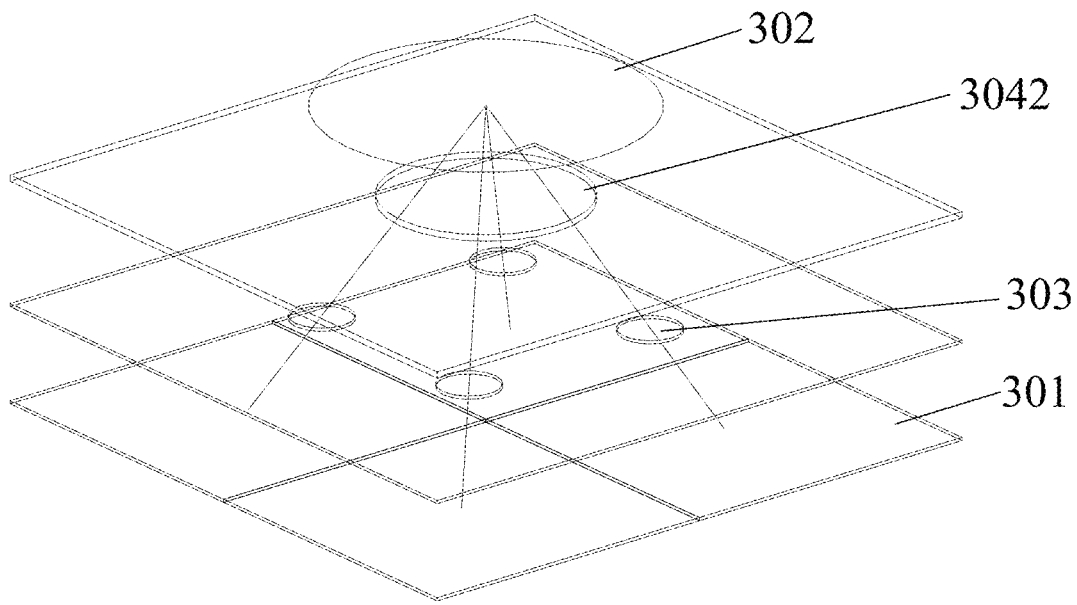
Figure 9:
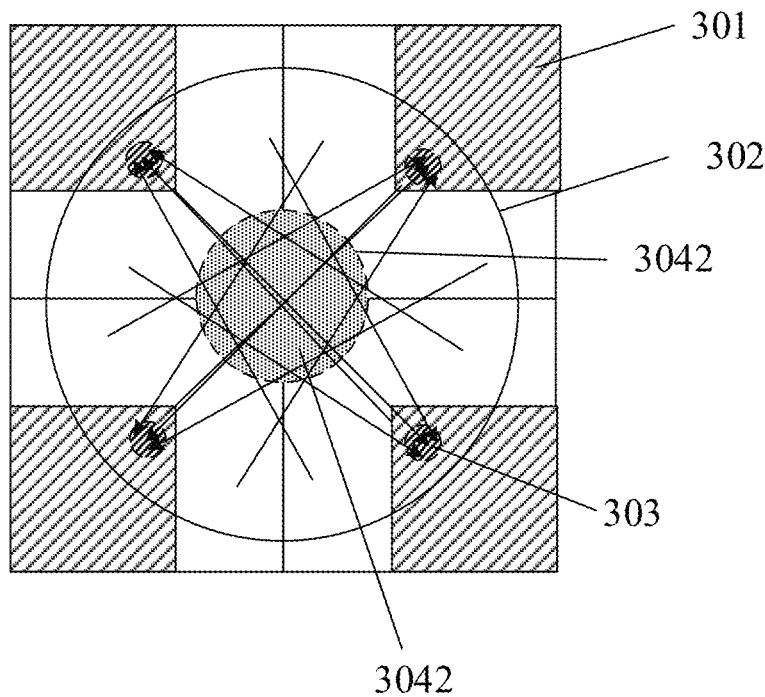

Of course, four small holes of the top light shielding layer corresponding to the four optical sensing pixels 301 can also be combined into one large hole, for example, a hole 3042 shown in FIGS. 8 and 9.

Hereinafter, a fingerprint detection apparatus according to embodiments of the present application will be described with reference to FIGS. 10 to 13.

Figure 10:
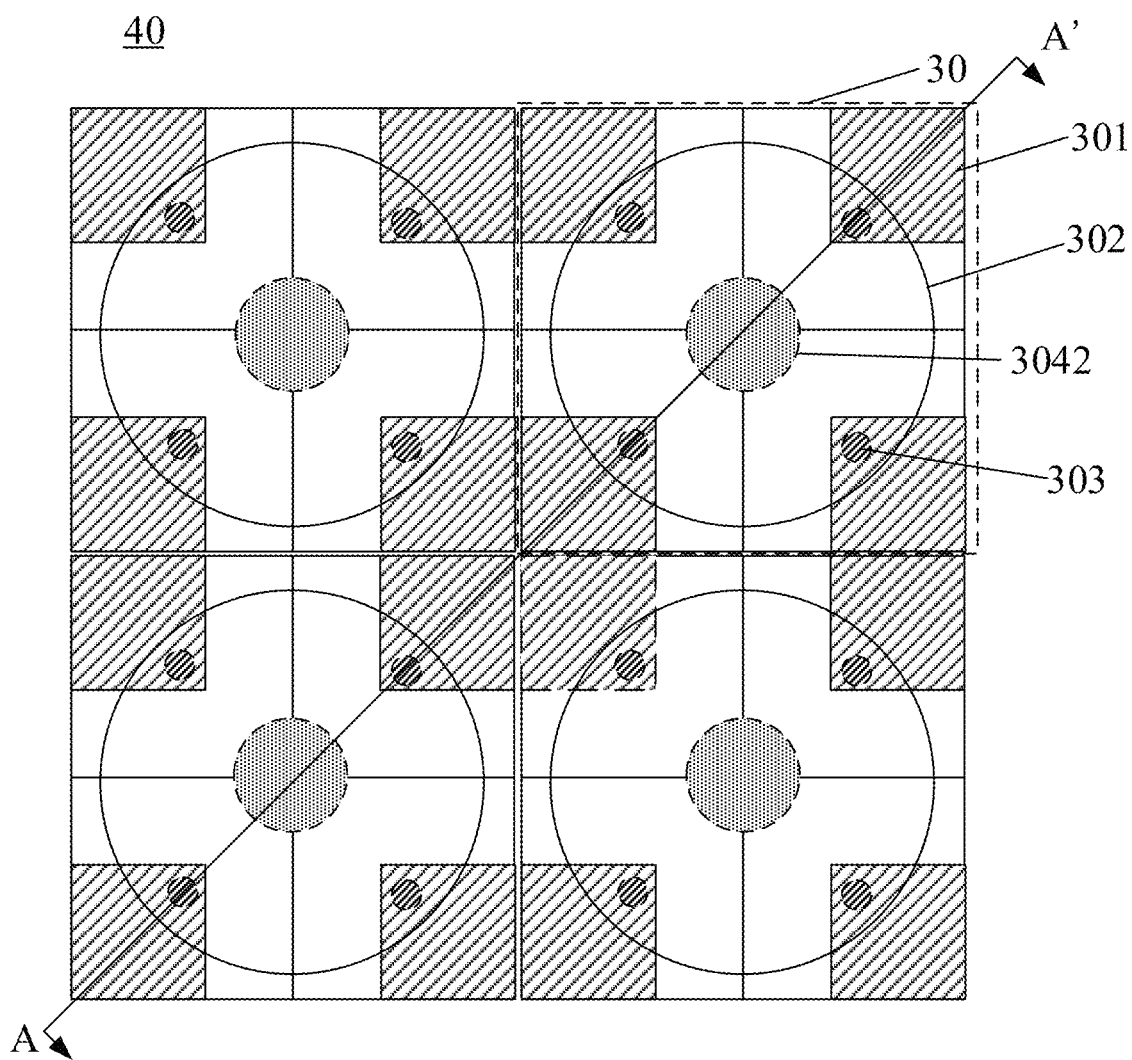
FIGS. 10 to 13 are examples of a fingerprint detection apparatus according to embodiments of the present application.

As shown in FIG. 10, the fingerprint detection apparatus 40 may include four fingerprint detection units 30 as shown in FIG. 9. The four fingerprint detection units 30 are distributed in a rectangular array.

Figure 11:
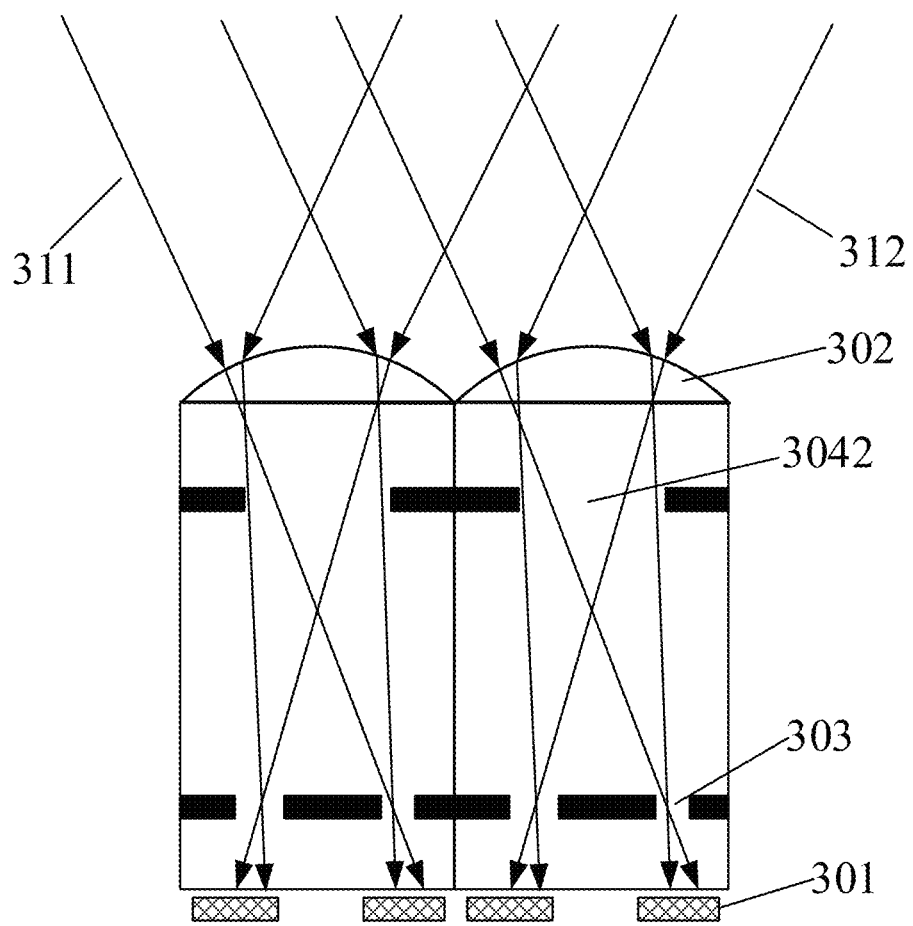

As shown in FIG. 11, FIG. 11 may be a schematic side cross-sectional view of the fingerprint detection apparatus 40 shown in FIG. 10 in an A-A' direction. In this case, a first oblique light signal 311 corresponds to a first fingerprint identification region, and a second oblique light signal 312 corresponds to a second fingerprint identification region. A fingerprint identification region of the fingerprint detection apparatus 40 may include the first fingerprint identification region and an added region in the A-A' direction, and the added region may be a region in the second fingerprint identification region that does not overlap the first fingerprint identification region.

In other words, compared with a fingerprint detection apparatus that only receives an oblique light signal in one direction, the fingerprint identification region of the fingerprint detection apparatus 40 additionally includes the added region, which effectively increases a visible region (i.e., a field of view).

In addition, an overlapping region of the first fingerprint identification region and the second fingerprint identification region can effectively improve an image resolution of a fingerprint image, thereby improving a fingerprint identification effect.

Of course, the fingerprint detection unit 30 may also include three light shielding layers.

Figure 12:
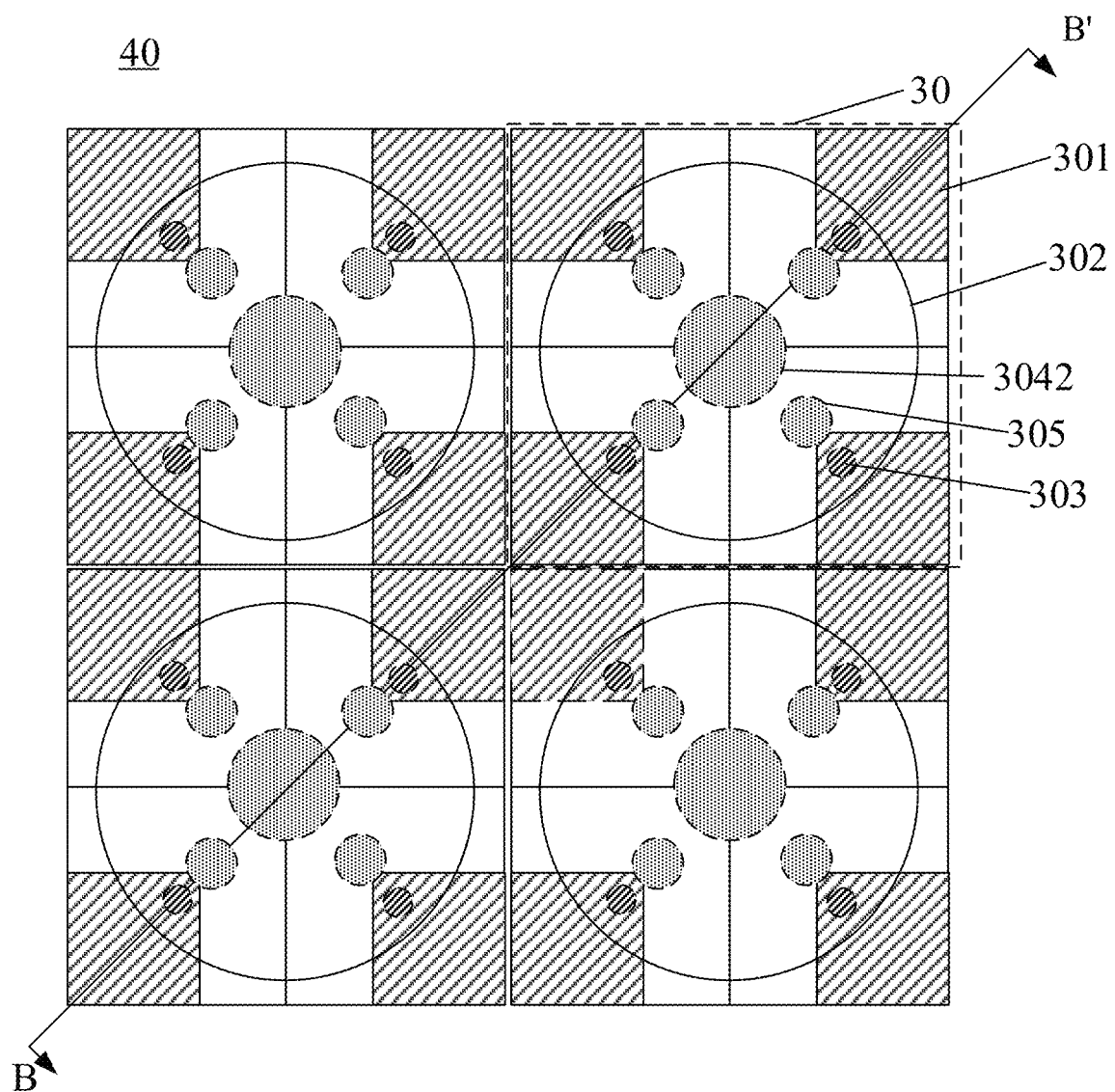

For example, as shown in FIG. 12, the fingerprint detection unit 30 may include a top light shielding layer, a middle light shielding layer, and a bottom light shielding layer, where the top light shielding layer is provided with one hole 3042 corresponding to the four optical sensing pixels 301 in the fingerprint detection unit 30, the middle light shielding layer is provided with four holes 305 corresponding to the four optical sensing pixels 301 respectively, and the bottom light shielding layer is provided with four holes 303 corresponding to the four optical sensing pixels 301 respectively.

In other words, the fingerprint detection apparatus 40 may include four fingerprint detection units 30 distributed in a rectangular array. Each fingerprint detection unit 30 may include three light shielding layers.

Figure 13:
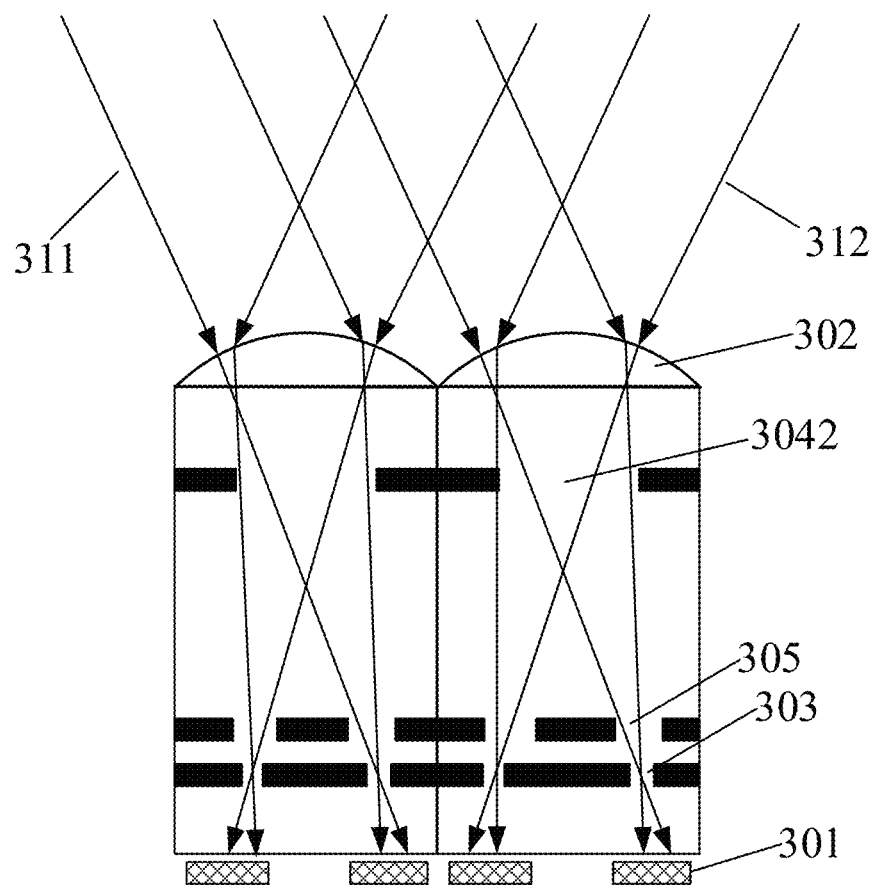

As shown in FIG. 13, FIG. 13 may be a schematic side cross-sectional view of the fingerprint detection apparatus 40 shown in FIG. 12 in a B-B' direction. Compared with a fingerprint detection unit including two light shielding layers, the fingerprint detection units 30 can avoid crosstalk of oblique light signals received by photosensitive regions of adjacent optical sensing pixels to improve a fingerprint identification effect of the fingerprint identification apparatus.

Figure 14:
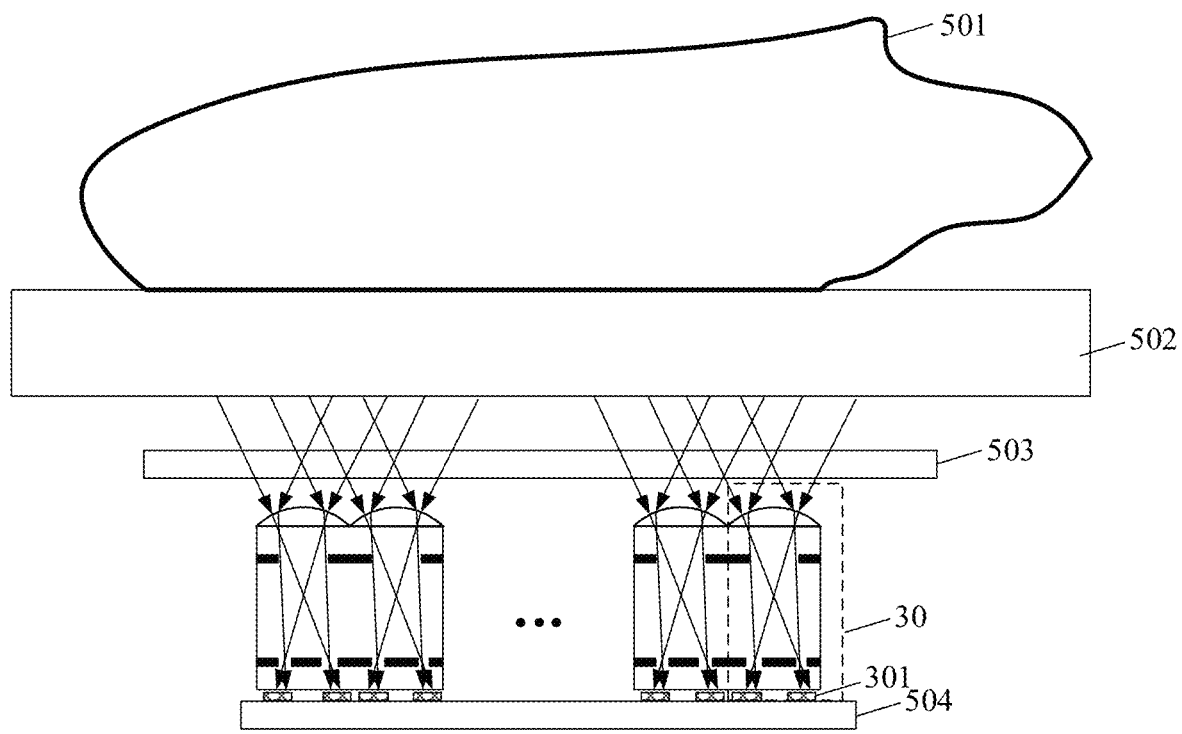
FIG. 14 is a side cross-sectional view of an electronic device including fingerprint detection units according to an embodiment of the present application.

FIG. 14 is a schematic block diagram of an electronic device including a plurality of fingerprint detection units.

As shown in FIG. 14, the electronic device 50 may include a display screen 502, a filter 503 located below the display screen 502, and a plurality of fingerprint detection units 30 located below the filter 503, where optical sensing pixels 301 of each fingerprint detection unit 30 may be disposed on an upper surface of a substrate 504. The optical sensing pixels 301 of each fingerprint detection unit 30 and the substrate 504 may be referred to as a fingerprint sensor or an image sensor.

A fingerprint detection process based on oblique light signals in multiple directions according to an embodiment of the present application will be described below with reference to FIGS. 15 to 21. For ease of understanding, the following takes oblique light signal in four directions as an example to illustrate the fingerprint detection process.

Figure 15:
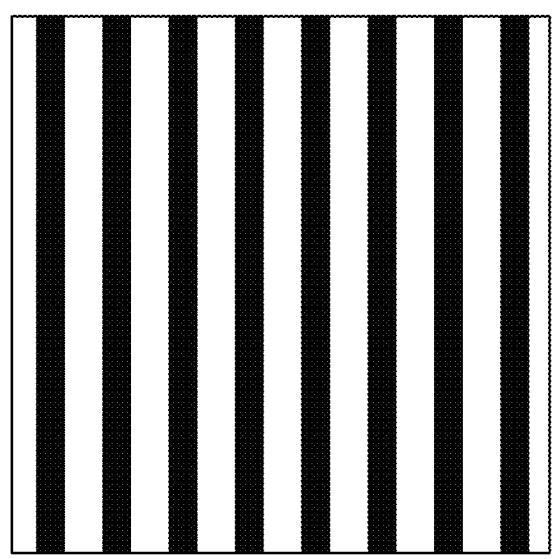
FIGS. 15 to 21 are schematic diagrams of fingerprint images in a fingerprint detection process according to an embodiment of the present application.
Figure 16:
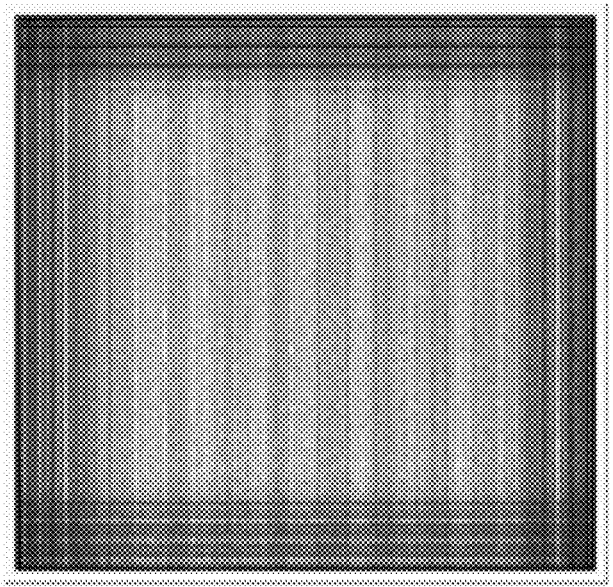

In a case that a light signal received by a fingerprint detection apparatus is a light signal carrying a pattern of bright and dark stripes as shown in FIG. 15, and four optical sensing pixels corresponding to each micro-lens in the fingerprint detection apparatus are configured to receive light signals in four different directions, since a pixel array receives light signals in multiple directions at the same time, and four pixels corresponding to one micro-lens image light signals in different imaging regions simultaneously, an image formed by the optical sensing pixel array in the fingerprint detection apparatus is a superimposed image of different imaging regions, which is a blurry image, for example, an image as shown in FIG. 16.

In some embodiments of the present application, a first image, a second image, a third image, and a fourth image can be obtained by extracting and processing the original image in FIG. 16.

Figure 17:
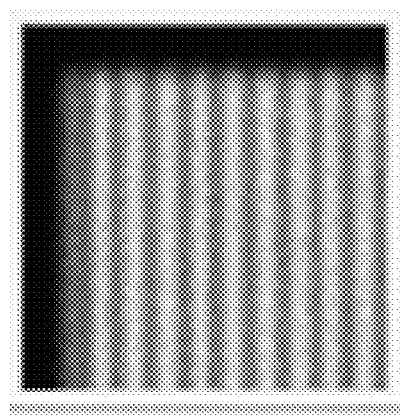
Figure 18:
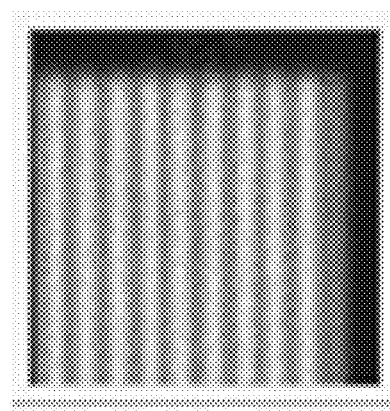
Figure 19:
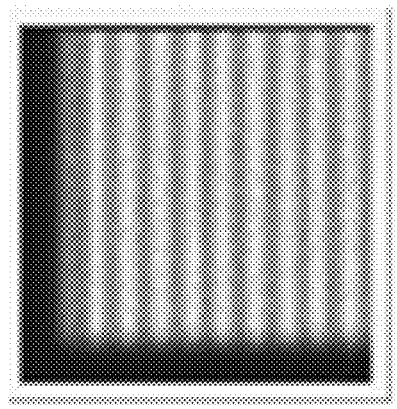
Figure 20:
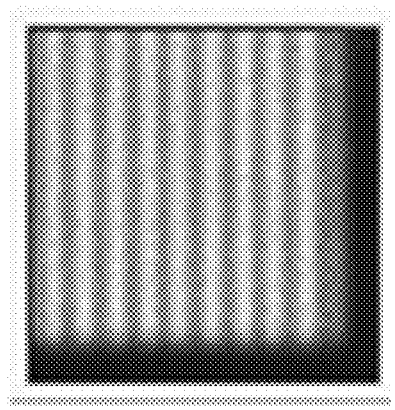

For example, a first optical sensing pixel in the optical sensing pixel array corresponding to each micro-lens receives a light signal in a first direction, and an original image generated by a plurality of optical sensing pixels in the optical sensing pixel array that receive the light signal in the first direction is as shown in FIG. 17. Since a plurality of pixels all receive light signals in the same direction, there is no superimposition of images in different imaging regions. Therefore, a processing unit can perform processing and obtain a first image shown in FIG. 17 corresponding to the light signal in the first direction, which is a clear image. Similarly, as shown in FIGS. 18 to 20, the processing unit can perform processing and obtain a second image shown in FIG. 18 corresponding to a light signal in a second direction, a third image shown in FIG. 19 corresponding to a light signal in a third direction, and a fourth image shown in FIG. 20 corresponding to a light signal in a fourth direction.

Figure 21:
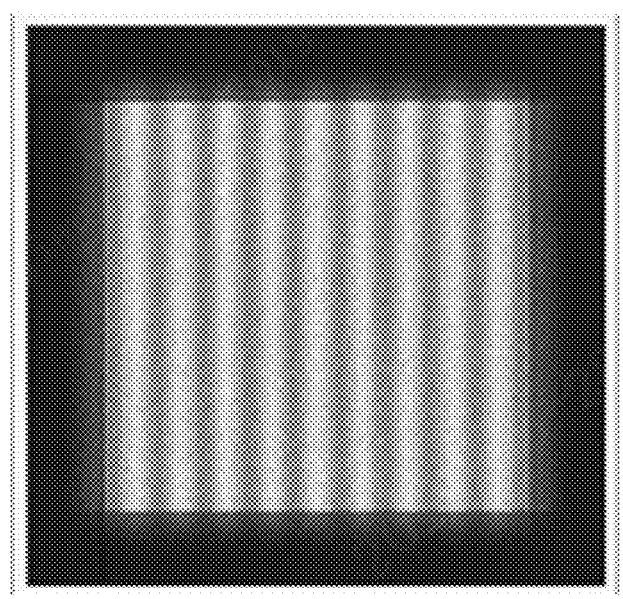

In some embodiments of the present application, the first image, the second image, the third image, and the fourth image may be processed and reconstructed to form a clear image as shown in FIG. 21.

For example, the first image, the second image, the third image, and the fourth image may be moved by a distance of several image pixels in the image respectively to form the clear image as shown in FIG. 21.

In other words, the first image may be moved left and up by a distance of several image pixels, the second image may be moved right and up by a distance of several pixels, the third image may be moved left and down by a distance of several pixels, and the fourth image may be moved right and down by a distance of several pixels, so as to form the clear image as shown in FIG. 21.

In other words, when one micro-lens corresponds to four optical sensing pixels, the four optical sensing pixels can be allowed to respectively receive oblique light signals in different directions through a light path design. Furthermore, when a surface of the optical sensing pixel array is covered with a layer of micro-lens array, the optical sensing pixels may perform imaging based on the oblique light signals in four directions so as to obtain an original image. Since the original image is an image formed by superimposing images in four oblique directions, an algorithm can be used to reconstruct the original image, and a clear reconstructed image can thus be obtained.

In other words, based on the number of image pixels that need to be moved in an image corresponding to an oblique light signal in a single direction and a contrast difference of a reconstructed image, whether an image corresponding to each direction reaches the clearest position can be evaluated.

Since a thickness of the display screen is constant, and relative positions of the display screen and the fingerprint detection apparatus are basically unchanged, an original image can be captured first (for example, the image shown in FIG. 15), and the number of image pixels that need to be moved in an image corresponding to an oblique light signal in each direction is determined as a moving image parameter when imaging quality of a reconstructed image is clearest. Furthermore, in the subsequent fingerprint capturing process, a clear image can be reconstructed based on the moving image parameter.

It should be understood that the original image may be a fingerprint image, or any pattern with a clear contrast that is originally covered on the surface of the display screen. For example, the image in FIG. 15 is similar to forms of a fingerprint ridge and a fingerprint valley in a fingerprint image. When a light signal received by a fingerprint detection apparatus is a light signal that is reflected or scattered by a finger, an image obtained by a processing unit through processing may be similar to the images shown in FIGS. 16 to 20 before processing and reconstruction. And a fingerprint image after processing and reconstruction may be similar to the image shown in FIG. 21, which is a clear fingerprint image.

In addition, when an electronic device installed with a fingerprint detection apparatus is used by a user, an installation distance between the fingerprint detection apparatus and the display screen changes in case of a strong impact, or the installation distance between the fingerprint detection apparatus and the display screen fluctuates during mass production, a distance of image pixels moved by the four images changes. In this case, the distance of the image pixels moved by the four images under the condition of the installation distance change can be automatically calibrated to ensure the clarity, noise ratio and contrast of a reconstructed image, so as to ensure a fingerprint detection effect of the fingerprint detection apparatus and improve user experience.

In other words, if the position of a fingerprint module relative to the display screen is offset, an original image can be used to re-determine a distance of image pixels to be moved by each image. It can also be determined that the position of the fingerprint module relative to the display screen has been offset by evaluating that quality of the image is lower than a preset threshold or a value measured by an accelerometer exceeds the preset threshold.

In addition, by comparing similarity between a center region of a reconstructed image and an overlapping region of a single image, whether clarity of the reconstructed image reaches an optimal state can be secondarily judged.

It should be understood that the accompanying drawings are only examples of embodiments of the present application and should not be understood as limitation on the present application.

For example, alternatively, the number of light shielding layers in at least one light shielding layer included in the fingerprint detection apparatus is greater than two.

For another example, the fingerprint detection apparatus may further include an image sensor driving unit, a microprogrammed control unit (MCU) and other devices.

An embodiment of the present application further provides an electronic device, and the electronic device may include a display screen and the fingerprint detection apparatus of the above embodiments of the present application, where the fingerprint detection apparatus is disposed below the display screen to implement under-screen optical fingerprint detection. The electronic device may be any electronic device having a display screen.

The display screen may use the display screen in the above description, such as an OLED display screen or other display screens. For a related description of the display screen, reference may be made to illustration of the display screen in the above description, and for brevity, no further details are provided herein.

In some embodiments of the present application, a foam layer may be provided below the display screen, and the foam layer may be provided with at least one hole above the fingerprint detection apparatus, and the at least one hole is configured to transmit a light signal reflected by a finger to the fingerprint detection apparatus.

For example, there is a layer of black foam below the display screen, and the black foam may be provided with a hole above the fingerprint detection apparatus. When a finger is placed above the illuminated display screen, the finger will reflect light emitted by the display screen, and reflected light reflected by the finger penetrates the display screen and is transmitted to the fingerprint detection apparatus through the at least one hole. A fingerprint is a diffuse reflector whose reflected light exists in all directions.

In this case, a specific light path in the fingerprint detection apparatus can be used to make an optical sensing pixel array in the fingerprint detection apparatus receive oblique light signals in multiple directions, and a processing unit in the fingerprint detection apparatus or a processing unit connected to the fingerprint detection apparatus can obtain a reconstructed fingerprint image through an algorithm, and then perform fingerprint identification.

In some embodiments of the present application, there may or may not be a gap between the fingerprint detection apparatus and the display screen.

For example, there may be a gap of 0-1000 μm between the fingerprint detection apparatus and the display screen.

In some embodiments of the present application, the fingerprint detection apparatus may output a captured image to an MCU, an FPGA, a DSP, a computer-specific processor, or a dedicated processor of an electronic device to perform fingerprint identification.

It should be understood that specific examples in embodiments of the present application are just for helping those skilled in the art better understand the embodiments of the present application, rather than for limiting the scope of the present application.

It should be understood that terms used in embodiments of the present application and the claims appended hereto are merely for the purpose of describing particular embodiments, and are not intended to limit the embodiments of the present application. For example, the use of a singular form of "a", "the above" and "the" in the embodiment of the present application and the claims appended hereto are also intended to include a plural form, unless otherwise clearly indicated herein by context.

Those of ordinary skill in the art may be aware that, units of the examples described in the embodiments disclosed in this paper may be implemented by electronic hardware, computer software, or a combination of the two. To clearly illustrate interchangeability between the hardware and the software, the foregoing illustration has generally described composition and steps of the examples according to functions. Whether these functions are performed by hardware or software depends on particular applications and designed constraint conditions of the technical solutions. Persons skilled in the art may use different methods to implement the described functions for every particular application, but it should not be considered that such implementation goes beyond the scope of the present application.

In several embodiments provided in the present application, it should be understood that, the disclosed system and apparatus may be implemented in other manners. For example, the described apparatus embodiments are merely exemplary. For example, the unit division is merely logical function division and may be other division in actual implementation. For example, a plurality of units or components may be combined or integrated into another system, or some features may be ignored or not performed. In addition, the displayed or discussed mutual coupling or direct coupling or communication connection may be indirect coupling or communication connection through some interfaces, apparatuses or units, and may also be electrical, mechanical, or connection in other forms.

The units described as separate parts may or may not be physically separate, and parts displayed as units may or may not be physical units, may be located at one location, or may be distributed on a plurality of network units. Some or all of the units may be selected depending on actual requirements to achieve the objectives of the solutions of the embodiments of the present application.

In addition, functional units in the embodiments of the present application may be integrated into a processing unit, or each unit may exist alone physically, or two or more than two units may be integrated into one unit. The integrated unit may be implemented in a form of hardware, or may be implemented in a form of a software functional unit.

When the integrated unit is implemented in a form of a software functional unit and sold or used as an independent product, the integrated unit may be stored in a computer-readable storage medium. Based on such an understanding, the technical solutions of the present application essentially, or the part contributing to the prior art, or all or some of the technical solutions may be implemented in a form of a software product. The computer software product is stored in a storage medium and includes several instructions for instructing a computer device (which may be a personal computer, a server, a network device, or the like) to perform all or some of the steps of the method described in the embodiments of the present application. The foregoing storage medium includes a variety of media capable of storing program codes, such as a USB disk, a mobile hard disk, a read-only memory (ROM), a random access memory (RAM), a magnetic disk, and an optical disk.

The foregoing description is only a specific implementation manner of the present application. The protection scope of the present application, however, is not limited thereto. Various equivalent modifications or replacements may be readily conceivable to any person skilled in the art within the technical scope disclosed in the present application, and such modifications or replacements shall fall within the protection scope of the present application. Therefore, the protection scope of the present application shall be subject to the protection scope of the claims.

What is claimed is:

1. A fingerprint detection apparatus, wherein the fingerprint detection apparatus is applied under a display screen to implement under-screen optical fingerprint detection, and the fingerprint detection apparatus comprises a plurality of fingerprint detection units distributed in an array or disposed alternately, and each of the plurality of fingerprint detection units comprises:
   one micro-lens configured to be disposed under the display screen;
   a plurality of optical sensing pixels, a center position of a photosensitive region of each of the plurality of optical sensing pixels being offset relative to a center position of the same optical sensing pixel; and
   at least one light shielding layer disposed between the one micro-lens and the plurality of optical sensing pixels, each of the at least one light shielding layer being provided with a hole corresponding to the plurality of optical sensing pixels,
   wherein after being converged by the one micro-lens, oblique light signals in multiple directions reflected from a finger above the display screen are respectively transmitted to photosensitive regions of the plurality of optical sensing pixels through the hole provided in the at least one light shielding layer, and the oblique light signals are configured to detect fingerprint information of the finger,
   wherein a distance between a center position of each of the plurality of optical sensing pixels and a center position of the one micro-lens is less than a distance between a center position of a photosensitive region of the same optical sensing pixel and the center position of the one micro-lens.

2. The fingerprint detection apparatus according to claim 1, wherein a light spot region is formed on the photosensitive region of each of the plurality of optical sensing pixels through the hole provided in the at least one light shielding layer, and a center position of the light spot region is offset by a first distance relative to a projection of a center position of the one micro-lens on a plane where the plurality of optical sensing pixels are located, and a connecting line between the center position of the one micro-lens and the center position of the light spot region forms a first included angle with a direction perpendicular to the display screen, and the first distance is inversely proportional to a cotangent of the first included angle; and
   wherein a vertical distance between the one micro-lens and the plurality of optical sensing pixels is equal to a product of the cotangent of the first included angle and the first distance.

3. The fingerprint detection apparatus according to claim 2, wherein the light spot region is disposed on a side of the photosensitive region close to or away from the one micro-lens.

4. The fingerprint detection apparatus according to claim 1, wherein the center position of the photosensitive region of each of the plurality of optical sensing pixels is offset in a direction away from or close to a center position of the plurality of optical sensing pixels relative to the center position of the same optical sensing pixel.

5. The fingerprint detection apparatus according to claim 4, wherein the plurality of optical sensing pixels are disposed below the one micro-lens, and the center position of the photosensitive region of each of the plurality of optical sensing pixels is offset in a direction away from the center position of the plurality of optical sensing pixels relative to the center position of the same optical sensing pixel.

6. The fingerprint detection apparatus according to claim 4, wherein the plurality of optical sensing pixels are respectively located below a plurality of micro-lenses adjacent to the one micro-lens, and the center position of the photosensitive region of each of the plurality of optical sensing pixels is offset in a direction away from or close to the center position of the plurality of optical sensing pixels relative to the center position of the same optical sensing pixel.

7. The fingerprint detection apparatus according to claim 4, wherein the center position of the photosensitive region of each of the plurality of optical sensing pixels is offset along a diagonal line of the same optical sensing pixel so that the center position of the photosensitive region of each of the plurality of optical sensing pixels is located on the diagonal line of the same optical sensing pixel.

8. The fingerprint detection apparatus according to claim 4, wherein the center position of the photosensitive region of each of the plurality of optical sensing pixels is offset along a side length of the same optical sensing pixel so that a connecting line of the center position of the photosensitive region of each of the plurality of optical sensing pixels and the center position of the same optical sensing pixel is parallel to the side length of the same optical sensing pixel.

9. The fingerprint detection apparatus according to claim 1, wherein the center position of the photosensitive region of each of the plurality of optical sensing pixels is offset by a first distance relative to the center position of the same optical sensing pixel, each of the plurality of optical sensing pixels is a rectangular pixel, and the first distance is less than or equal to a side length P of the rectangular pixel.

10. The fingerprint detection apparatus according to claim 9, wherein the first distance ranges from P/10 to P/2.

11. The fingerprint detection apparatus according to claim 1 wherein an included angle of an oblique light signal in each of the multiple directions relative to the display screen ranges from 10 degrees to 60 degrees.

12. The fingerprint detection apparatus according to claim 11, wherein included angles of the oblique light signals in the multiple directions relative to the display screen are the same.

13. The fingerprint detection apparatus according to claim 1, wherein the at least one light shielding layer is a plurality of light shielding layers, and a bottom light shielding layer of the plurality of light shielding layers is provided with a plurality of holes corresponding to the plurality of optical sensing pixels respectively, so that the one micro-lens converges the oblique light signals in the multiple directions to the photosensitive regions of the plurality of optical sensing pixels respectively through the plurality of holes;
wherein apertures of the holes in the plurality of light shielding layers corresponding to the same optical sensing pixel are sequentially decreased from top to bottom; and
wherein a top light shielding layer of the plurality of light shielding layers is provided with at least one hole corresponding to the plurality of optical sensing pixels.

14. The fingerprint detection apparatus according to claim 13, wherein a metal wiring layer of the plurality of optical sensing pixels is disposed at a back focal plane position of the one micro-lens, and the metal wiring layer is respectively provided with a plurality of holes above the photosensitive regions of plurality of optical sensing pixels to form the bottom light shielding layer of the plurality of light shielding layers.

15. The fingerprint detection apparatus according to claim 1, wherein the at least one light shielding layer is one light shielding layer, and the one light shielding layer is provided with a plurality of oblique holes corresponding to the plurality of optical sensing pixels respectively, so that the one micro-lens converges the oblique light signals in the multiple directions to the photosensitive regions of the plurality of optical sensing pixels respectively through the plurality of oblique holes.

16. The fingerprint detection apparatus according to claim 15, wherein a thickness of the one light shielding layer is greater than or equal to a preset thickness, so that the plurality of oblique holes are respectively configured to transmit the oblique light signals in the multiple directions.

17. The fingerprint detection apparatus according to claim 1, wherein the fingerprint detection apparatus further comprises:
a transparent medium layer,
wherein the transparent medium layer is configured to connect the one micro-lens, the at least one light shielding layer and the plurality of optical sensing pixels.

18. The fingerprint detection apparatus according to claim 1, wherein the fingerprint detection apparatus further comprises:
a filter layer,
wherein the filter layer is disposed in light paths between the one micro-lens and the plurality of optical sensing pixels or above the one micro-lens, and the filter layer is configured to filter out a light signal with a non-target wavelength band and transmit a light signal with a target wavelength band.

19. An electronic device, comprising:
a display screen, and a fingerprint detection apparatus;
wherein the fingerprint detection apparatus is disposed under the display screen to implement under-screen optical fingerprint detection; and
wherein the fingerprint detection apparatus comprises a plurality of fingerprint detection units distributed in an array or disposed alternately, and each of the plurality of fingerprint detection units comprises:
one micro-lens configured to be disposed under the display screen;
a plurality of optical sensing pixels, a center position of a photosensitive region of each of the plurality of optical sensing pixels being offset relative to a center position of the same optical sensing pixel; and
at least one light shielding layer disposed between the one micro-lens and the plurality of optical sensing pixels, each of the at least one light shielding layer being provided with a hole corresponding to the plurality of optical sensing pixels,
wherein after being converged by the one micro-lens, oblique light signals in multiple directions reflected from a finger above the display screen are respectively transmitted to photosensitive regions of the plurality of optical sensing pixels through the hole provided in the at least one light shielding layer, and the oblique light signals are configured to detect fingerprint information of the finger,
wherein a distance between a center position of each of the plurality of optical sensing pixels and a center position of the one micro-lens is less than a distance between a center position of a photosensitive region of the same optical sensing pixel and the center position of the one micro-lens.

* * * * *